(12) United States Patent
Uchiyama

(10) Patent No.: US 10,347,568 B2
(45) Date of Patent: Jul. 9, 2019

(54) ELECTRO-OPTICAL DEVICE HAVING FLEXIBLE WIRING SUBSTRATE, AND ELECTRONIC APPARATUS

(71) Applicant: SEIKO EPSON CORPORATION, Tokyo (JP)

(72) Inventor: Suguru Uchiyama, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/886,067

(22) Filed: Feb. 1, 2018

(65) Prior Publication Data

US 2018/0226326 A1 Aug. 9, 2018

(30) Foreign Application Priority Data

Feb. 6, 2017 (JP) .................................. 2017-019305
Oct. 16, 2017 (JP) .................................. 2017-200122

(51) Int. Cl.
*H01L 23/00* (2006.01)
*H01L 23/495* (2006.01)
(Continued)

(52) U.S. Cl.
CPC .... *H01L 23/49524* (2013.01); *G02F 1/13452* (2013.01); *G02F 1/13458* (2013.01);
(Continued)

(58) Field of Classification Search
CPC ......... H01L 23/49524; H01L 23/49537; H01L 23/3672; H01L 23/3675; H01L 24/50;
(Continued)

(56) References Cited

U.S. PATENT DOCUMENTS 5,528,403 A * 6/1996 Kawaguchi ......... G02F 1/13452
349/149
5,668,700 A * 9/1997 Tagusa ................ H01L 23/5387
257/E21.516

(Continued)

FOREIGN PATENT DOCUMENTS

| JP | 2007-196404 A | 8/2007 |
|---|---|---|
| JP | 2009-251182 A | 10/2009 |
| JP | 2010-027762 A | 2/2010 |

OTHER PUBLICATIONS

Rigiflex Technology, "How Applications can Benefit from Flexible Printed Circuit Boards".*

*Primary Examiner* — Anthony Ho
*Assistant Examiner* — Mohammad M Hoque
(74) *Attorney, Agent, or Firm* — Oliff PLC

(57) ABSTRACT

An electro-optical device includes a first drive IC and a second drive IC which are respectively mounted on a first flexible wiring substrate and a second flexible wiring substrate in a first mounting substrate and a second mounting substrate (first substrate). A first extension substrate and a second extension substrate (second substrate) which are configured by a flexible wiring substrate are connected to end portions of the first mounting substrate and the second mounting substrate, and a first protective film and a second protective film are attached to both surfaces in connection portions. The first protective film and the second protective film extend to positions covering the first drive IC and the second drive IC.

15 Claims, 13 Drawing Sheets

(51) Int. Cl.
*G02F 1/1345* (2006.01)
*G02F 1/1333* (2006.01)
*H01L 23/367* (2006.01)
*H01L 23/538* (2006.01)

(52) U.S. Cl.
CPC .... *G02F 1/133308* (2013.01); *H01L 23/3672* (2013.01); *H01L 23/3675* (2013.01); *H01L 23/49537* (2013.01); *H01L 23/5387* (2013.01); *H01L 24/50* (2013.01); *G02F 2001/13332* (2013.01); *G02F 2201/50* (2013.01); *H01L 2924/14* (2013.01); *H01L 2924/19105* (2013.01)

(58) Field of Classification Search
CPC .......... G02F 1/13458; G02F 1/133308; G02F 1/13452; G02F 2001/13332
USPC ........................................................ 257/668
See application file for complete search history.

(56) References Cited

U.S. PATENT DOCUMENTS

| | | | | |
|---|---|---|---|---|
| 5,777,610 A * | 7/1998 | Sugimoto | ............. | H05K 1/147 345/206 |
| 6,433,414 B2 * | 8/2002 | Saito | .................. | H01L 23/4985 257/679 |
| 6,897,912 B2 * | 5/2005 | Kawakami | ........ | G02F 1/133615 349/151 |
| 7,161,650 B2 * | 1/2007 | Hirano | ................ | G02F 1/13452 349/150 |
| 7,164,460 B2 * | 1/2007 | Hagiwara | ........... | G02F 1/13452 257/E21.514 |
| 7,557,451 B2 * | 7/2009 | Shinojima | ........... | G02F 1/13452 174/260 |
| 7,580,103 B2 * | 8/2009 | Kawaguchi | ....... | G02F 1/133308 349/110 |
| 7,705,951 B2 * | 4/2010 | Takenaka | ............ | G02F 1/13452 349/149 |
| 8,039,753 B2 * | 10/2011 | Jang | ...................... | H05K 1/189 174/254 |
| 2005/0088830 A1 * | 4/2005 | Yumoto | .............. | G02F 1/13452 361/749 |
| 2005/0224561 A1 * | 10/2005 | Kurasawa | ........... | G02F 1/13452 228/180.22 |
| 2006/0119761 A1 * | 6/2006 | Okuda | ................ | G02F 1/13452 349/58 |
| 2006/0125981 A1 * | 6/2006 | Okuda | ................ | G02F 1/133308 349/110 |
| 2006/0221269 A1 * | 10/2006 | Kawaguchi | ....... | G02F 1/133308 349/58 |
| 2007/0222822 A1 | 9/2007 | Ito | | |
| 2009/0250250 A1 * | 10/2009 | Ishii | .................... | G02F 1/13452 174/254 |
| 2011/0102726 A1 * | 5/2011 | Nobeoka | ............. | G02F 1/13306 349/150 |
| 2015/0230331 A1 * | 8/2015 | Lee | ...................... | H05K 1/0259 361/220 |
| 2017/0294610 A1 * | 10/2017 | Sasaki | ................ | H01L 27/3276 |
| 2018/0143483 A1 * | 5/2018 | Jang | ..................... | G02B 6/0018 |

\* cited by examiner

ELECTRO-OPTICAL DEVICE HAVING FLEXIBLE WIRING SUBSTRATE, AND ELECTRONIC APPARATUS

BACKGROUND

1. Technical Field

The present invention relates to an electro-optical device including an electro-optical panel to which a substrate is connected, and an electronic apparatus including the electro-optical device.

2. Related Art

An electro-optical device such as a liquid crystal display device or an organic electroluminescence device often adopts a structure in which a mounting substrate (first substrate) having a drive IC mounted on a flexible wiring substrate is connected to an electro-optical panel. In addition, a structure has been proposed in which an extension substrate (second substrate) configured by a flexible wiring substrate in an end portion on a side opposite to the electro-optical panel side with respect to the drive IC of the mounting substrate is connected by an anisotropic conductive film (ACF), and the extension substrate is connected to a higher circuit (refer to JP-A-2009-251182).

However, there is a problem that in a case where a mounting substrate and an extension substrate are connected by an ACF or the like, a connection portion between the mounting substrate and the extension substrate does not have sufficient moisture resistance and the like and reliability of insulation between terminals is low. Particularly, there is a problem that it is difficult to ensure the insulation between the terminals, in use under a severe environment such as a high-temperature and high-humidity bias state.

SUMMARY

An advantage of some aspects of the invention is to provide an electro-optical device that can increase reliability of a connection portion between a first substrate and a second substrate which are connected to an electro-optical panel, and an electronic apparatus.

According to an aspect of the invention, there is provided an electro-optical device including an electro-optical panel, a first substrate that includes a flexible wiring substrate of which an end portion is connected to the electro-optical panel and includes a drive IC which is mounted on one surface of the flexible wiring substrate, a second substrate that includes a flexible wiring substrate of which one end is bonded to one end portion on a side opposite to the electro-optical panel side with respect to the drive IC of the first substrate, and a protective film that is disposed such that a connection portion between the first substrate and the second substrate is covered with at least a portion on the one surface side and on the other surface side which is a surface on a side opposite to the one surface.

In the device, since a second substrate is connected to a first substrate on which a drive IC is mounted, an expensive flexible wiring substrate used for the first substrate can be shortened. Thus, cost can be reduced. In addition, since a connection portion between the first substrate and the second substrate is covered with a protective film, strength and moisture resistance of the connection portion between the first substrate and the second substrate can be enhanced. Therefore, reliability of the connection portion between the first substrate and the second substrate can be enhanced.

In the device, it may be possible to adopt a configuration in which the protective film covers at least the connection portion on the other surface side.

In the device, it may be possible to adopt a configuration in which the protective film covers at least the connection portion on the one surface side.

In the device, it may be possible to adopt a configuration in which the protective film extends from the connection portion to a position covering the drive IC, on the one surface side. In this case, since a connection portion between a flexible wiring substrate used for a first substrate and a drive IC can be protected by a protective film, reliability of the first substrate can be enhanced.

In the device, it may be possible to adopt a configuration in which the protective film extends from the connection portion to a position on a way toward the drive IC, on the one surface side.

In the device, it may be possible to adopt a configuration in which a thickness of the protective film is greater than or equal to 0.1 mm and is smaller than or equal to a thickness of the drive IC.

In the device, it may be possible to adopt a configuration in which the protective film includes a one-surface side protective film covering the connection portion from the one surface side and the other surface side protective film covering the connection portion from the other surface side.

In the device, it may be possible to adopt a configuration in which the one-surface side protective film and the other surface side protective film are equal in size.

In the device, it may be possible to adopt a configuration in which, when viewed from a thickness direction of the first substrate, the one-surface side protective film and the other surface side protective film are provided at positions where the one-surface side protective film and the other surface side protective film overlap each other.

In the device, it may be possible to adopt a configuration in which the protective film has insulation properties and moisture resistance. In this case, insulation properties and moisture resistance of a connection portion between a first substrate and a second substrate can be enhanced.

In the device, it may be possible to adopt a configuration in which the protective film is a polyester film.

In the device, it may be possible to adopt a configuration in which an adhesive layer is provided between the protective film and the connection portion and a thickness of the adhesive layer is 45±6 μm. In this case, it is possible to make the protective film adequately adhere to the connection portion and to suppress intrusion of moisture into the connection portion via the adhesive layer.

In the device, it may be possible to adopt a configuration in which the protective films respectively overlap all the terminals of the first substrate and all the terminals of the second substrate, which are respectively electrically connected in the connection portion, when viewed from a thickness direction of the first substrate. According to the configuration, since the protective film covers all terminals of the first substrate and all terminals of the second substrate, moisture can be prevented from including into the connection portion.

In the device, it may be possible to adopt a configuration in which the electro-optical device further includes a holder that supports the electro-optical panel from both sides in a thickness direction, and the holder includes a first holder member that supports the electro-optical panel from one side in a thickness direction, a second holder member that supports the electro-optical panel from the other side in the thickness direction, a first heat dissipation plate portion that overlaps a part where the drive IC of the first mounting substrate is mounted from one side of the electro-optical panel in a thickness direction, and a second heat dissipation plate portion that overlaps the part where the drive IC of the first mounting substrate is mounted from the other side of the electro-optical panel in the thickness direction. According to the configuration, it is possible to enable heat generated by the drive IC to escape from the first heat dissipation plate portion and the second heat dissipation plate portion.

In the device, it may be possible to adopt a configuration in which filling materials that fill a gap on the one surface side and a gap on the other surface side with respect to a portion where the drive IC of the first substrate is mounted are disposed between the first heat dissipation plate portion and the second heat dissipation plate portion. According to the configuration, it is possible to efficiently transfer heat generated by the drive IC to the first heat dissipation plate portion and the second heat dissipation plate portion.

In the device, it may be possible to adopt a configuration in which a plurality of the first substrates are connected to one side of the electro-optical panel in a state of being overlapped in a thickness direction.

In the device, it may be possible to adopt a configuration in which two substrates of the plurality of first substrates are connected to the electro-optical panel.

An electro-optical device according to the invention can be used for various electronic apparatuses. In a case where the electronic apparatus is a projection type display device, the projection type display device includes a light source unit that emits light supplied to the electro-optical device, and a projection optical system that projects light modulated by the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
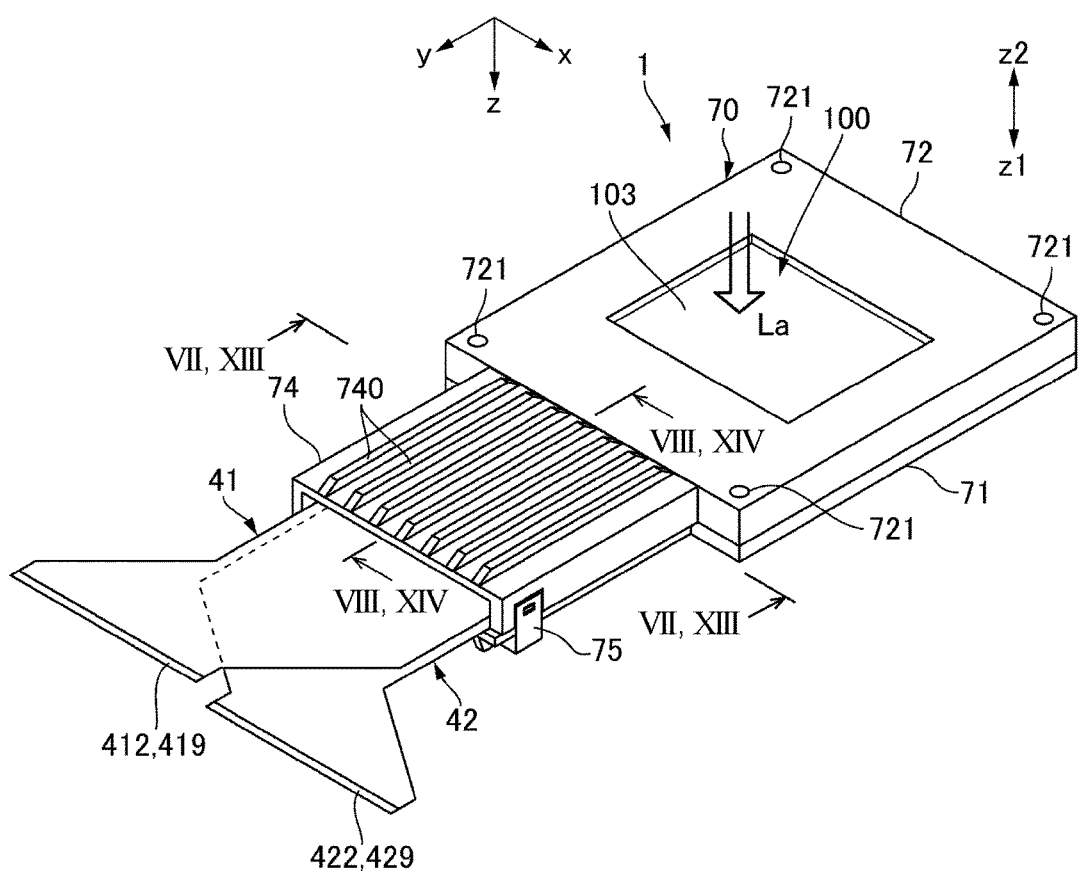
FIG. 1 is an explanatory view schematically illustrating a state where an aspect of an electro-optical device to which the invention is applied is viewed in an oblique direction.

Embodiments of the invention will be described with reference to the drawings. In the drawings referred to in the following description, since the respective members and the like are scaled to a recognizable extent on the drawings, the respective members are scaled differently, and the number of members is reduced. Hereinafter, each direction is represented by using an orthogonal coordinate system configured by the x axis, the y axis, and the z axis. In an electro-optical device 1 exemplified below, two mounting substrates 5 (a first mounting substrate 51 and a second mounting substrate 52) are connected to an electro-optical panel 100 as a "first substrate" according to the invention, and extension substrates (a first extension substrate 41 and a second extension substrate 42) are respectively connected to the two mounting substrates 5 (the first mounting substrate 51 and the second mounting substrate 52) as a "second substrate" according to the invention.

Configuration of Electro-Optical Device 1

Basic Configuration

Figure 2:
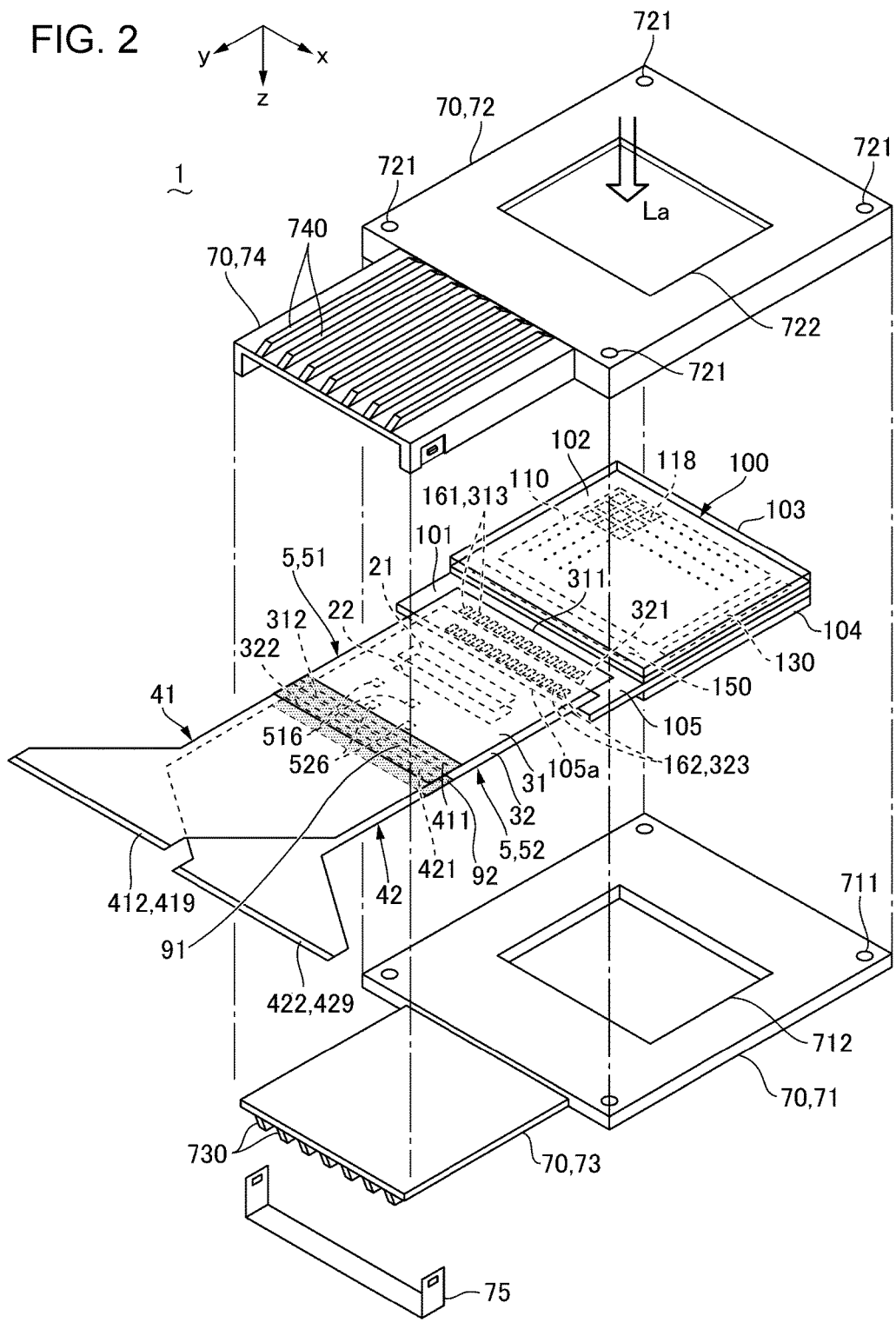
FIG. 2 is an exploded perspective view in a state where a holder is removed from an electro-optical panel, in the electro-optical device illustrated in FIG. 1.
Figure 3:
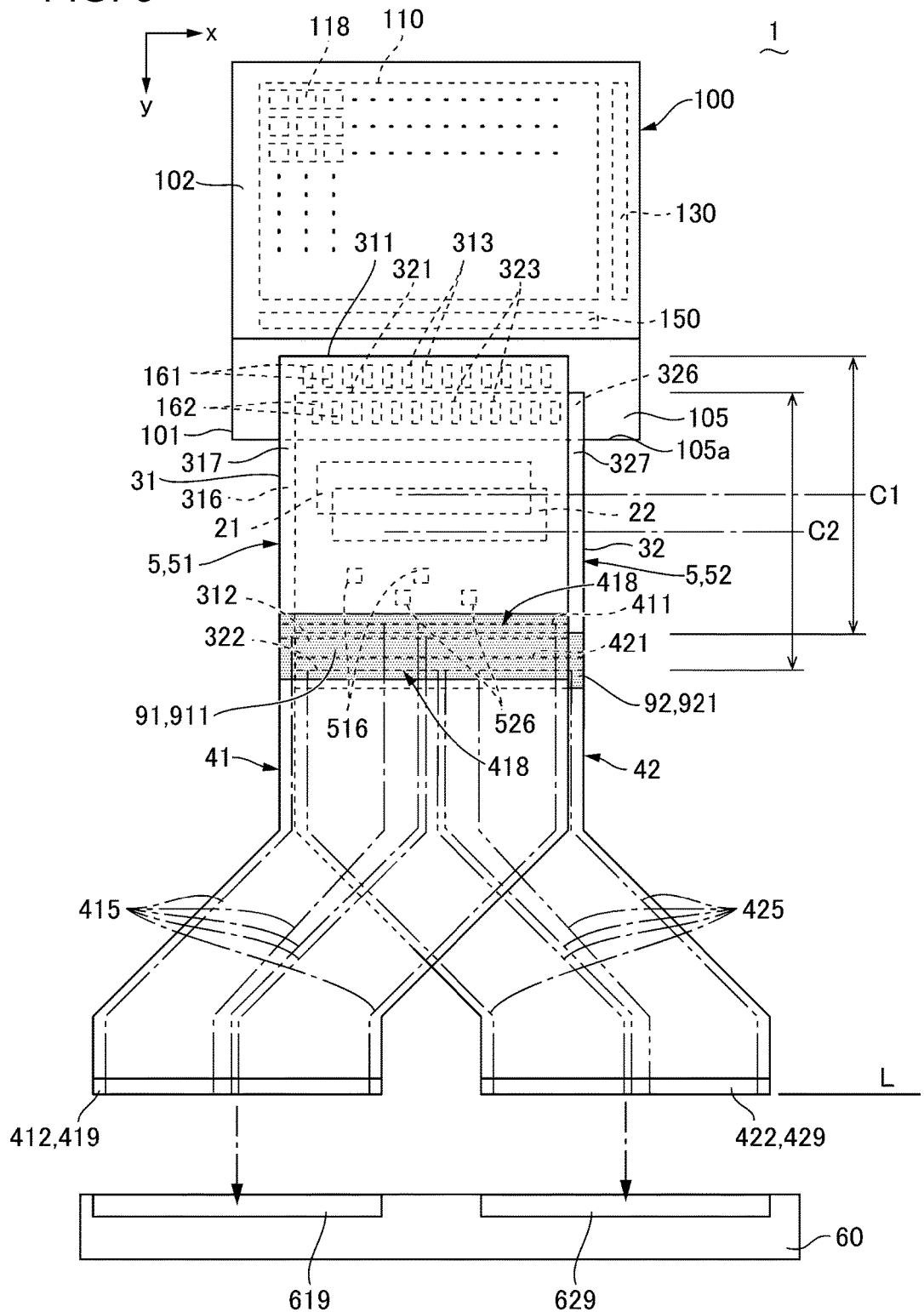
FIG. 3 is an explanatory view schematically illustrating a planar configuration of the electro-optical panel and the like illustrated in FIG. 1.
Figure 4:
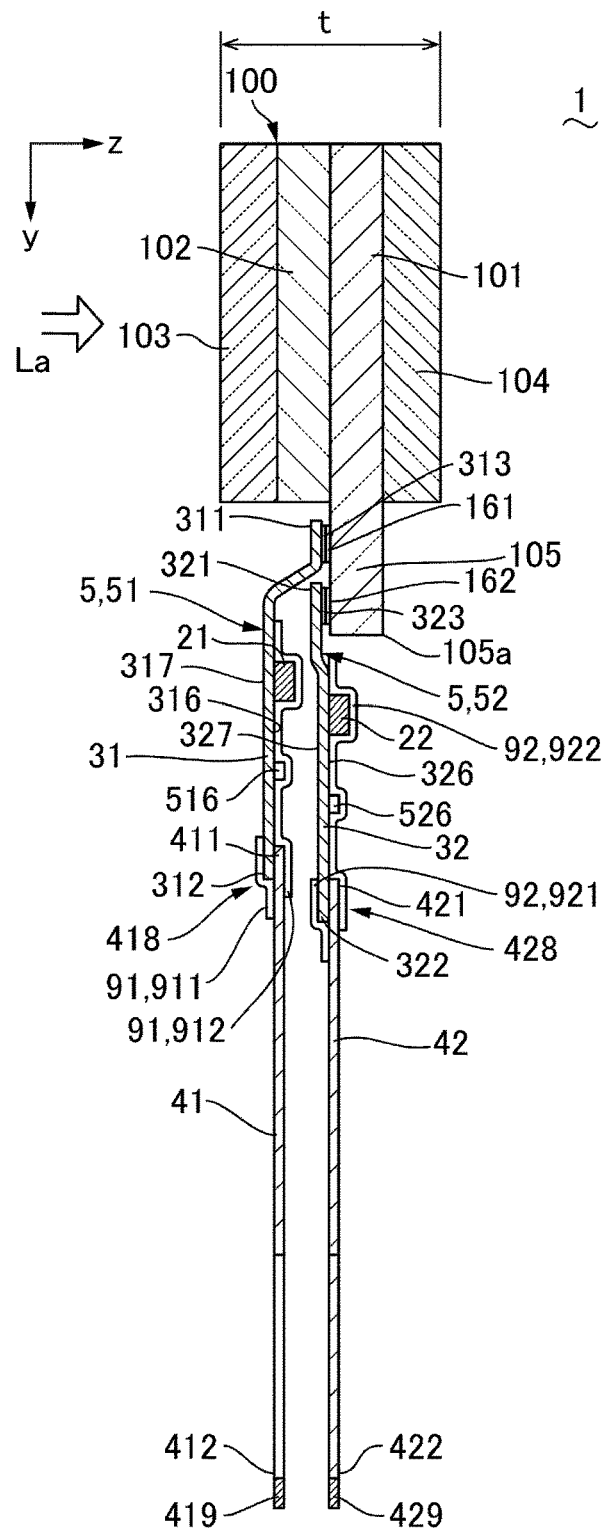
FIG. 4 is an explanatory view schematically illustrating a state where the electro-optical panel and the like illustrated in FIG. 1 are cut along the electro-optical panel and a second flexible wiring substrate.

FIG. 1 is an explanatory view schematically illustrating a state where one aspect of an electro-optical device 1 to which the invention is applied is viewed in an oblique direction. FIG. 2 is an exploded perspective view in a state where a holder 70 is removed from an electro-optical panel 100, in the electro-optical device 1 illustrated in FIG. 1. FIG. 3 is an explanatory view schematically illustrating a planar configuration of the electro-optical panel 100 and the like illustrated in FIG. 1. FIG. 4 is an explanatory view schematically illustrating a state where the electro-optical panel 100 and the like illustrated in FIG. 1 are cut along the electro-optical panel 100 and a second flexible wiring substrate 32. FIGS. 2 and 3 illustrate a small number of terminals and wires. In addition, FIGS. 2, 3, and 4, terminals for connecting drive ICs to flexible wiring substrates, terminals for connecting flexible wiring substrates to extension substrates, and the like are omitted.

In FIGS. 1 to 4, the electro-optical device 1 includes the electro-optical panel 100, a plurality of the mounting substrates 5 (the first mounting substrate 51 and the second mounting substrate 52) connected to one side of the electro-optical panel 100, and a holder 70 that supports the electro-optical panel 100 from both sides in a thickness direction (z direction). The electro-optical device 1 is a liquid crystal device used as a light valve or the like which will be described below, and the electro-optical device 1 includes a liquid crystal panel as the electro-optical panel 100.

In the electro-optical panel 100, a counter substrate 102 on which a common electrode (not illustrated) and the like are formed is bonded to an element substrate 101 on which pixel electrodes 118 and the like are formed, by a sealing material (not illustrated). A liquid crystal layer (not illustrated) is provided in a region surrounded by a sealing material, in the electro-optical panel 100. The electro-optical panel 100 according to the present form is a transmissive liquid crystal panel. Accordingly, a light-transmitting substrate such as a heat-resistant glass or a quartz substrate is used for the element substrate 101 and the counter substrate 102.

In the electro-optical panel 100, a region where pixel electrodes 118 are arranged in the x direction and the y direction is a pixel region 110, and in the electro-optical panel 100, a region overlapping the pixel region 110 is a display region. In the element substrate 101, an extension portion 105 that protrudes in the y direction from the counter substrate 102 is provided, and a plurality of terminals including first terminals 161 for receiving an image signal are arranged at a predetermined pitch, along an edge (one side 105a) of the extension portion 105. In addition, in the extension portion 105, a plurality of terminals including second terminals 162 for receiving an image signal are arranged at a predetermined pitch at a position on a side opposite to the pixel region 110, in which the first terminals 161 are interposed therebetween. Accordingly, the first terminals 161 and the second terminals 162 are arranged along an edge of the element substrate 101 at a position shifted in the y direction. In FIGS. 2 and 3, the first mounting substrate 51 and the second mounting substrate 52 are illustrated in a shifted state in the x direction such that configurations of the first mounting substrate 51 and the second mounting substrate 52 can be easily understood, but, in the present embodiment, positions of the first terminals 161 and the second terminals 162 in the x direction are the same. However, as illustrated in FIG. 2 and FIG. 3, the first terminals 161 and the second terminals 162 may be shifted by a half pitch in the x direction. The first terminals 161 are connected to the first mounting substrate 51 and include a terminal for receiving an image signal. The second terminals 162 are connected to the second mounting substrate 52 and include a terminal for receiving an image signal.

In the electro-optical panel 100, light source light La (see FIG. 1) incident from the counter substrate 102 side is modulated while the light source light is emitted from the element substrate 101 side, and is emitted as display light. The electro-optical panel 100 includes a dust-proof glass that is placed so as to overlap at least one of a surface on a side opposite to the element substrate 101 side of the counter substrate 102 and a surface on a side opposite to the counter substrate 102 side of the element substrate 101. In the present form, the electro-optical panel 100 includes a first dust-proof glass 103 disposed to overlap on a surface on a side opposite to the element substrate 101 side of the counter substrate 102 through an adhesive or the like, and a second dust-proof glass 104 disposed to overlap and affixed to a surface on a side opposite to the counter substrate 102 side of the element substrate 101 through an adhesive or the like.

Configuration of Holder 70

As illustrated in FIGS. 1 and 2, the holder 70 includes a first holder member 71 formed of a metal which supports the electro-optical panel 100 from one side z1 in a thickness direction, and a second holder member 72 formed of a metal which supports the electro-optical panel 100 from the other side z2 in the thickness direction. The first holder member 71 and the second holder member 72 are bonded together by, for example, a method such as stopping bolts (not illustrated) through-holes 711 and 721 formed in the first holder member 71 and the second holder member 72. In addition, openings 712 and 722 through which light source light or display light passes are formed at positions overlapping a display region (pixel region 110) of the electro-optical panel 100, in the first holder member 71 and the second holder member 72.

The holder 70 includes a first heat dissipation plate portion 73 formed of a metal and disposed on a side where the mounting substrate 5 extends with respect to the first holder member 71 in the y direction, and a second heat dissipation plate portion 74 formed of a metal and positioned on a side where the mounting substrate 5 extends with respect to the second holder member 72 in the y direction. The first heat dissipation plate portion 73 and the second heat dissipation plate portion 74 face each other in the z direction.

In the present form, the first heat dissipation plate portion 73 is formed separately from the first holder member 71, and the second heat dissipation plate portion 74 is formed integrally with the second holder member 72. Accordingly, the first heat dissipation plate portion 73 is fixed to the second heat dissipation plate portion 74 by a fixing member 75 in a state where a plurality of mounting substrates 5 are interposed between the first heat dissipation plate portion 73 and the second heat dissipation plate portion 74. Heat dissipation fins 730 are formed from a plurality of protrusion portions extending in the y direction in a state of being in parallel in the x direction, on a surface of the first heat dissipation plate portion 73 on a side opposite to the second heat dissipation plate portion 74, and heat dissipation fins 740 are formed from the plurality of protrusion portions extending in the y direction in a state of being in parallel in the x direction, on a surface of the second heat dissipation plate portion 74 on a side opposite to the first heat dissipation plate portion 73.

Configuration of Mounting Substrate 5

As illustrated in FIGS. 2 to 4, on the element substrate 101 in the electro-optical device 1 of the present form, the plurality of mounting substrates 5 (a COF (Chip On Film) mounting flexible wiring substrate) having drive ICs which are mounted on one surface of each of the flexible wiring substrates are connected to one side (one side 105a of the element substrate 101) of the electro-optical panel 100 in a state of being overlapped with each other. In the present embodiment, the two mounting substrates 5 are connected to the electro-optical panel 100 in a state of being overlapped. More specifically, on the element substrate 101, the first mounting substrate 51 on which a first drive IC 21 is mounted on one surface 316 of the first flexible wiring substrate 31, and a second mounting substrate 52 on which the second drive IC 22 is mounted on one surface 326 of the second flexible wiring substrate 32 are connected to the electro-optical panel 100, in a state of being overlapped with each other in the z direction. Accordingly, an image signal and the like are output from the first drive IC 21 and the second drive IC 22 to the electro-optical panel 100 via the first flexible wiring substrate 31 and the second flexible wiring substrate 32. On the first mounting substrate 51 and the second mounting substrate 52, electronic components 516 and 526 in addition to the first drive IC 21 and the second drive IC 22 are mounted on a side opposite to the electro-optical panel 100 with respect to the first drive IC 21 and the second drive IC 22. The electronic components 516 and 526 are element components such as capacitors.

In an end portion 311 of the first flexible wiring substrate 31, a plurality of first output electrodes 313 are formed at a position overlapping the element substrate 101, and a plurality of first output electrodes 313 are connected to the first terminals 161 and the like, respectively. In addition, in an end portion 321 of the second flexible wiring substrate 32, a plurality of second output electrodes 323 are formed at a position overlapping the element substrate 101, and a plurality of second output electrodes 323 are connected to the second terminals 162, respectively.

The first flexible wiring substrate 31 and the second flexible wiring substrate 32 both have a certain rectangular planar shape. In addition, the first drive IC 21 and the second drive IC 22 both have a rectangular planar shape. In addition, in the first drive IC 21 and the second drive IC 22, widths (dimensions in the y direction), lengths (dimensions in the x direction), circuit configurations, and the like are equal to each other, and the first drive IC 21 and the second drive IC 22 have the same configuration. In addition, in the first mounting substrate 51 and the second mounting substrate 52, mounting positions of the first drive IC 21 and the second drive IC 22 with respect to the first flexible wiring substrate 31 and the second flexible wiring substrate 32, and widths (dimensions in the x direction), lengths (dimensions in the y direction), wiring patterns, and the like of the first flexible wiring substrate 31 and the second flexible wiring substrate 32 are equal to each other, and the first mounting substrate 51 and the second mounting substrate 52 have the same configuration.

The first flexible wiring substrate 31 and the second flexible wiring substrate 32 connected to the electro-optical panel 100 are not shifted in the x direction and are shifted in the y direction. A part of the second flexible wiring substrate 32 overlaps the first flexible wiring substrate 31 and is connected to the electro-optical panel 100. In the present embodiment, the first flexible wiring substrate 31 and the second flexible wiring substrate 32 are not shifted in the x direction, but, in a case where the first terminals 161 and the second terminals 162 are arranged to be shifted by a half pitch, may be connected so as to be shifted by a half pitch of the first terminal 161 (by a half pitch of the second terminal 162), corresponding to shifting of the first terminal and the second terminal. The first flexible wiring substrate 31 and the second flexible wiring substrate 32 overlap each other over a wide range in the y direction. In addition, shifting of the first flexible wiring substrate 31 and the second flexible wiring substrate 32 in the y direction corresponds to shifting between a position where the first terminals 161 are arranged and a position where the second terminals 162 are arranged. Thus, the first flexible wiring substrate 31 and the second flexible wiring substrate 32 overlap each other over a wide range in the y direction.

The first drive IC 21 is mounted on a center C1 in a length direction (y direction) of the first flexible wiring substrate 31, or on the element substrate 101 side from the center C1. In addition, the second drive IC 22 is mounted on a center C2 in a length direction (y direction) of the second flexible wiring substrate 32, or on the element substrate 101 side from the center C2. In the present form, the first drive IC 21 is mounted on a position biased on the element substrate 101 from the center C1 of the length direction (y direction) of the first flexible wiring substrate 31. In addition, the second drive IC 22 is mounted on a position biased on the element substrate 101 from the center C2 of the length direction (y direction) of the second flexible wiring substrate 32.

In addition, both the first drive IC 21 and the second drive IC 22 are disposed in a region where the first flexible wiring substrate 31 and the second flexible wiring substrate 32 overlap each other. Thus, the first drive IC 21 is mounted on the first flexible wiring substrate 31 at a position where at least a part thereof overlaps the second flexible wiring substrate 32, and the second drive IC 22 is mounted on the second flexible wiring substrate 32 at a position where at least a part thereof overlaps the first flexible wiring substrate 31. In addition, the first drive IC 21 and the second drive IC 22 partially overlap each other. In contrast to this, an electronic component 516 mounted on the first flexible wiring substrate 31 and an electronic component 526 mounted on the second flexible wiring substrate 32 do not overlap each other.

A single-sided wiring substrate and a double-sided wiring substrate can be used for the first flexible wiring substrate 31 and the second flexible wiring substrate 32. In the present form, a single-sided wiring substrate is used for the first flexible wiring substrate 31 and the second flexible wiring substrate 32. Thus, output electrodes (first output electrode 313 and second output electrode 323), mounting electrodes of the first drive IC 21 and the second drive IC 22, wires, and the like (not illustrated) are formed on the one surface 316 and the one surface 326 (see FIG. 4) of the first flexible wiring substrate 31 and the second flexible wiring substrate 32. In addition, either a single-layer substrate in which wires are formed of a metal layer of the same layer and a multilayer substrate in which wires are formed of a plurality of metal layers may be used for the first flexible wiring substrate 31 and the second flexible wiring substrate 32, but, in the present form, a single-layer substrate is used for the first flexible wiring substrate 31 and the second flexible wiring substrate 32.

Configuration of Extension Substrate

On the first mounting substrate 51, one end 411 of a first extension substrate 41 is connected to an end portion 312 on a side opposite to the element substrate 101 side with respect to the first drive IC 21 of the first flexible wiring substrate 31, and a first end portion 412 side which is the other end of the first extension substrate 41 extends to a side opposite to the element substrate 101 side. The first extension substrate 41 is configured by a flexible wiring substrate, and a plurality of first wires 415 extend from the first end portion 412 toward the one end 411. A plurality of electrodes (not illustrated) formed in the end portion 312 of the first flexible wiring substrate 31 are connected to a plurality of electrodes (not illustrated) formed in the one end 411 of the first extension substrate 41. The first end portion 412 of the first extension substrate 41 is formed in a linear shape, and a first plug 419 of a substrate-to-substrate connector is configured therein.

On the second mounting substrate 52, one end 421 of a second extension substrate 42 is connected to an end portion 322 on a side opposite to the element substrate 101 side with respect to the second drive IC 22 of the second flexible wiring substrate 32, and a second end portion 422 side which is the other end of the second extension substrate 42 extends to a side opposite to the element substrate 101 side. A plurality of electrodes (not illustrated) formed in the end portion 322 of the second flexible wiring substrate 32 are connected to a plurality of electrodes (not illustrated) formed in the one end 421 of the second extension substrate 42. The electrodes formed on the second flexible wiring substrate 32 are connected to the electrode formed on the second extension substrate 42. The second extension substrate 42 is configured by a flexible wiring substrate, and a plurality of second wires 425 extend from the second end portion 422 toward the one end 421. The second end portion 422 of the second extension substrate 42 is formed in a linear shape, and a second plug 429 of a substrate-to-substrate connector is configured therein.

Here, a dimension of the first flexible wiring substrate 31 in the y direction is smaller than a dimension of the first extension substrate 41 in the y direction, and a dimension of the second flexible wiring substrate 32 in the y direction is smaller than a dimension of the second extension substrate 42 in the y direction. A single-sided wiring substrate and a double-sided wiring substrate can be used for the first extension substrate 41 and the second extension substrate 42. In the present form, a double-sided wiring substrate is used for the first extension substrate 41 and the second extension substrate 42.

The first extension substrate 41 and the second extension substrate 42 are bent in a direction where at least one of the extension substrates is separated from the other extension substrate, and as a result, the first end portion 412 of the first extension substrate 41 and the second end portion 422 of the second extension substrate 42 do not overlap each other and extend on a same linear line L. In the present form, the first extension substrate 41 is bent obliquely and linearly in a direction separated from the second extension substrate 42 in a middle position in the length direction (y direction), the second extension substrate 42 is bent obliquely and linearly in a direction separated from the first extension substrate 41 in a middle position in the length direction, and the first extension substrate 41 and the second extension substrate 42 are formed in a substantially symmetrical planar shape.

Here, the end portion 312 of the first flexible wiring substrate 31 and the end portion 322 of the second flexible wiring substrate 32 are shifted in the y direction. Accordingly, lengths of the first extension substrate 41 and the second extension substrate 42 are different from each other. In the present form, the end portion 312 of the first flexible wiring substrate 31 is positioned on the element substrate 101 side from the end portion 322 of the second flexible wiring substrate 32. Accordingly, the first extension substrate 41 is longer than the second extension substrate 42 by an amount corresponding to the amount of shift between the end portion 312 of the first flexible wiring substrate 31 and the end portion 322 of the second flexible wiring substrate 32 in the y direction. Thus, the first end portion 412 of the first extension substrate 41 and the second end portion 422 of the second extension substrate 42 do not overlap each other, and extend on the linear line L parallel to an edge of the element substrate 101 in the y direction.

In this state, a first plug 419 formed in the first end portion 412 of the first extension substrate 41 is coupled to a first socket 619 formed on the wiring substrate 60 configured by a rigid substrate, and a second plug 429 formed in the second end portion 422 of the second extension substrate 42 is coupled to a second socket 629 formed on the wiring substrate 60 configured by a rigid substrate. The wiring substrate 60 inputs various power supply voltages and various signals from a high-level circuit to the first drive IC 21 via the first extension substrate 41 and the first flexible wiring substrate 31. As a result, the first drive IC 21 outputs the various signals to the element substrate 101 via the first flexible wiring substrate 31. In addition, the wiring substrate 60 inputs various power supply voltages and various signals from a high-level circuit to the second drive IC 22 via the second extension substrate 42 and the second flexible wiring substrate 32. As a result, the second drive IC 22 outputs the various signals to the element substrate 101 via the second flexible wiring substrate 32.

In the present form, double-sided wiring substrates are used as the first extension substrate 41 and the second extension substrate 42. Thus, some parts of the first wire 415 and the second wire 425 may be formed on one surface of the first extension substrate 41 and one surface of the second extension substrate 42, and the other parts and ground wires of the first wires 415 and the second wires 425 may be formed on the other surfaces. In addition, a conductive pattern to which a ground potential is applied may be formed on all the other surfaces of the first extension substrate 41 and the second extension substrate 42.

Structure of Protective Film

Figure 5:
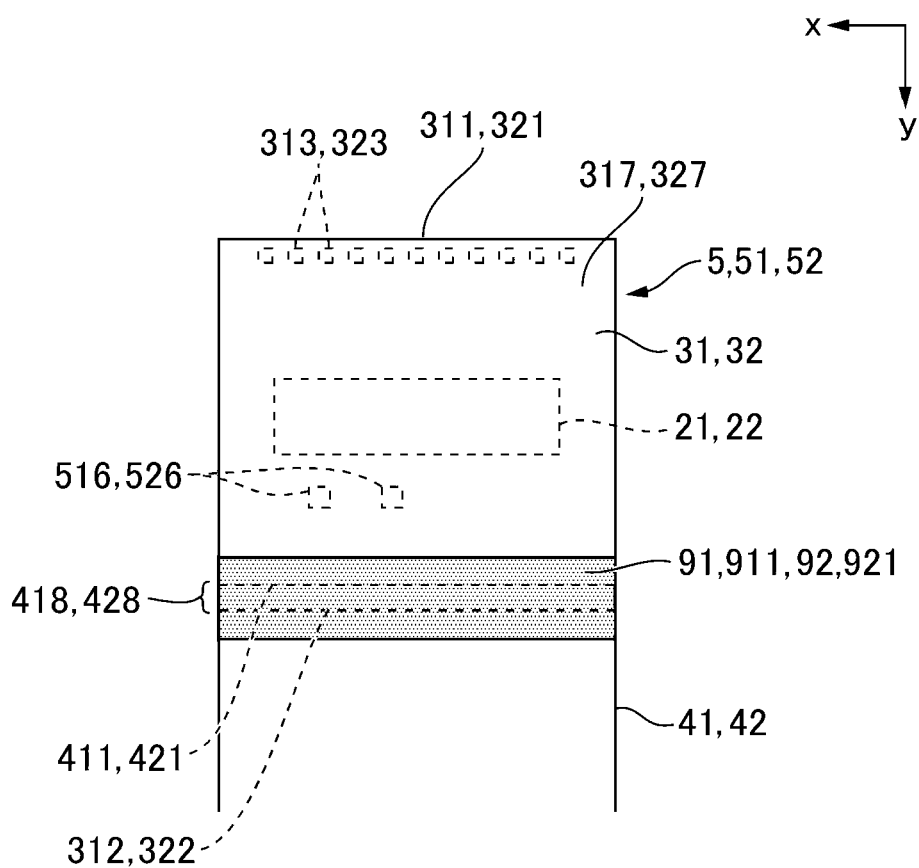
FIG. 5 is an explanatory view when a connection portion between a mounting substrate and an extension substrate illustrated in FIG. 2 is viewed from the other surface side of the mounting substrate.
Figure 6:
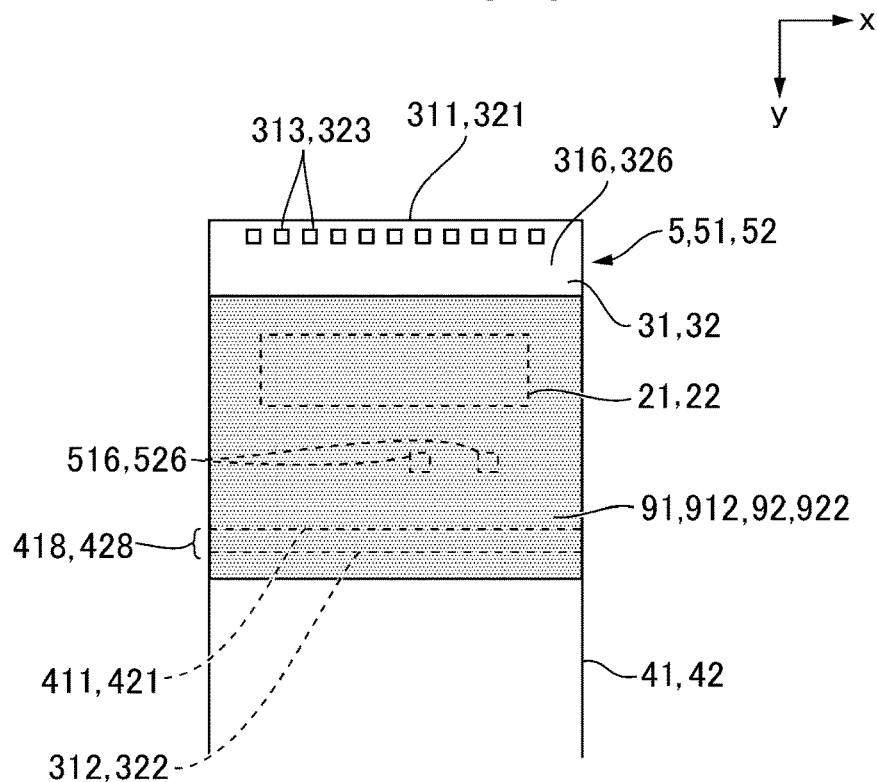
FIG. 6 is an explanatory view when the connection portion between a mounting substrate and an extension substrate illustrated in FIG. 2 is viewed from one surface side of the mounting substrate.

FIG. 5 is an explanatory view when a connection portion between the mounting substrate 5 and one of the extension substrates 41 and 42 illustrated in FIG. 2 is viewed from the other surface side of the mounting substrate 5. FIG. 6 is an explanatory view when a connection portion between the mounting substrate 5 and the other of the extension substrates 41 and 42 illustrated in FIG. 2 is viewed from one surface side of the mounting substrate 5.

As illustrated in FIGS. 4, 5, and 6, a first protective film 91 is affixed to a connection portion 418 between the first mounting substrate 51 and the first extension substrate 41 (a first protective film 91 is disposed at a connection portion 418 between the first mounting substrate 51 and the first extension substrate 41), so as to be covered by at least one of the one surface 316 side and the other surface 317 side which is a surface side opposite to the one surface 316 side. In addition, a second protective film 92 is affixed to a connection portion 428 between the second mounting substrate 52 and the second extension substrate 42, so as to be covered by at least one of the one surface 326 side and the other surface 327 side which is a surface side opposite to the one surface 326 side.

As illustrated in FIGS. 4 and 5, in the present form, a protective film 911 which covers the connection portion 418 between the first mounting substrate 51 and the first extension substrate 41 from the other surface 317 side is provided as the first protective film 91. In addition, a protective film 921 which covers the connection portion 428 between the second mounting substrate 52 and the second extension substrate 42 from the other surface 327 side is provided as the second protective film 92.

In addition, as illustrated in FIGS. 4 and 6, in the present form, a protective film 912 which covers the connection portion 418 between the first mounting substrate 51 and the first extension substrate 41 from the one surface 316 side is provided as the first protective film 91, and the protective film 912 extends from the connection portion 418 to a position which covers the first drive IC 21. In addition, a protective film 922 which covers the connection portion 428 between the second mounting substrate 52 and the second extension substrate 42 from the one surface 326 side is provided as the second protective film 92, and the protective film 922 extends from the connection portion 428 to a position which covers the second drive IC 22.

Here, the first protective film 91 (protective films 911 and 912) and the second protective film 92 (protective films 921 and 922) are formed of an adhesive film including a film of polyester, polyimide, polyethylene terephthalate, or the like, and has insulation properties and moisture resistance.

Heat Dissipation Structure

Figure 7:
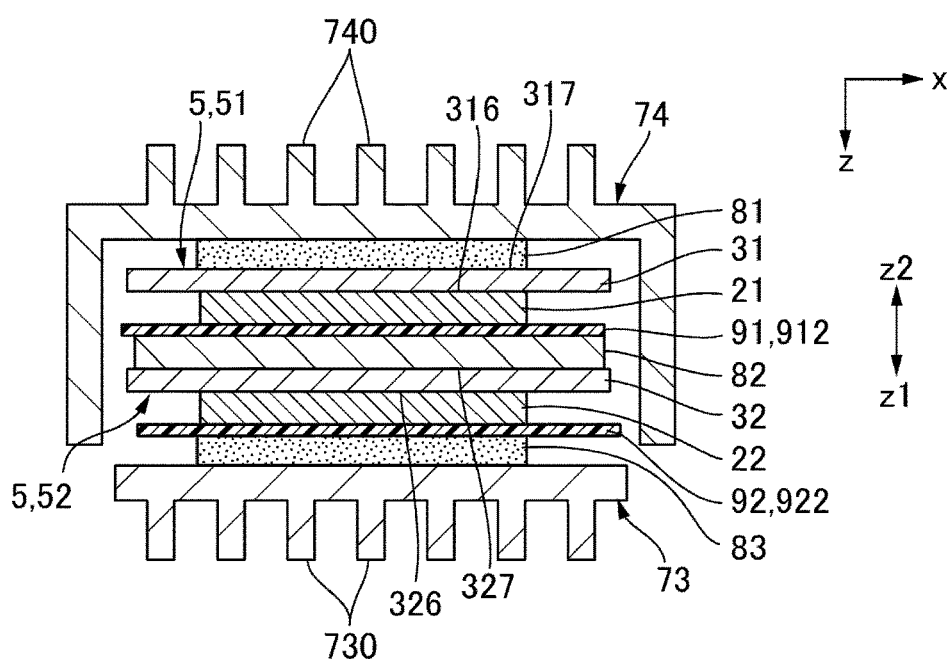
FIG. 7 is a cross-sectional view schematically illustrating a state where the electro-optical device illustrated in FIG. 1 is cut along line VII-VII.
Figure 8:
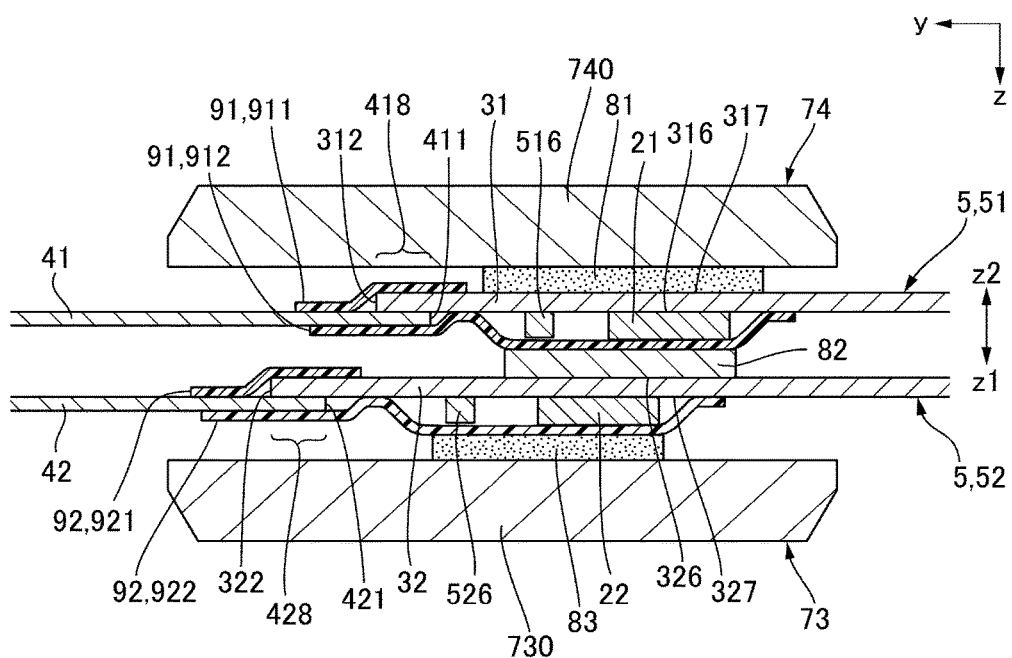
FIG. 8 is a cross-sectional view schematically illustrating a state where the electro-optical device illustrated in FIG. 1 is cut along line VIII-VIII.

FIG. 7 is a cross-sectional view schematically illustrating a state where the electro-optical device 1 illustrated in FIG. 1 is cut along a line VII-VII. FIG. 8 is a cross-sectional view schematically illustrating a state where the electro-optical device 1 illustrated in FIG. 1 is cut along a line VIII-VIII.

In the electro-optical device 1 according to the present form illustrated in FIG. 4, the sum total of thicknesses of the flexible wiring substrates (the first flexible wiring substrate 31 and the second flexible wiring substrate 32) used for the plurality of mounting substrates 5 (the first mounting substrate 51 and the second mounting substrate 52) and thicknesses of the drive ICs (the first drive IC 21 and the second drive IC 22) is equal to or less than the thickness t of the electro-optical panel 100. Thus, as illustrated in FIGS. 7 and 8, the first heat dissipation plate portion 73 and the second heat dissipation plate portion 74 are disposed on both sides of a part where the drive ICs (the first drive IC 21 and the second drive IC 22) are mounted in the thickness direction (z direction) in the plurality of mounting substrates 5 (the first mounting substrate 51 and the second mounting substrate 52). Here, the first heat dissipation plate portion 73 and the second heat dissipation plate portion 74 overlap the connection portion 418 between the first mounting substrate 51 and the first extension substrate 41 and the connection portion 428 between the second mounting substrate 52 and the second extension substrate 42 from both sides in a thickness direction.

In addition, in the present form, filling materials that fill gaps on one surface 316 and 326 sides and gaps on the other surface 317 and 327 sides with respect to parts where the drive ICs (the first drive IC 21 and the second drive IC 22) of the mounting substrates 5 (the first mounting substrate 51 and the second mounting substrate 52) are mounted are disposed between the first heat dissipation plate portion 73 and the second heat dissipation plate portion 74. Thus, it is possible to enable heat generated by the first drive IC 21 and the second drive IC 22 to efficiently escape from the first heat dissipation plate portion 73 and the second heat dissipation plate portion 74.

In the present form, an adhesive layer 81 (filling material) is provided between the other surface 317 of the first flexible wiring substrate 31 of the first mounting substrate 51 and the second heat dissipation plate portion 74, and the other surface 317 of the first flexible wiring substrate 31 adheres to the second heat dissipation plate portion 74. The adhesive layer 81 fixes the first mounting substrate 51 to the second heat dissipation plate portion 74, and promotes heat dissipation of the first drive IC 21. A heat transfer sheet 82 (filling material) configured by a silicone sheet or the like is provided between the protective film 912 (the first protective film 91) and the other surface 327 of the second flexible wiring substrate 32 of the second mounting substrate 52, on the one surface 316 side of the first flexible wiring substrate 31 of the first mounting substrate 51. An adhesive layer 83 (filling material) is provided between the one surface 326 side of the second flexible wiring substrate 32 of the second mounting substrate 52 and the first heat dissipation plate portion 73, and the protective film 922 (second protective film 92) adheres to the first heat dissipation plate portion 73. The adhesive layer 83 fixes the second mounting substrate 52 to the first heat dissipation plate portion 73, and promotes heat dissipation of the second drive IC 22.

Electrical Configuration of Electro-Optical Device 1

Figure 9:
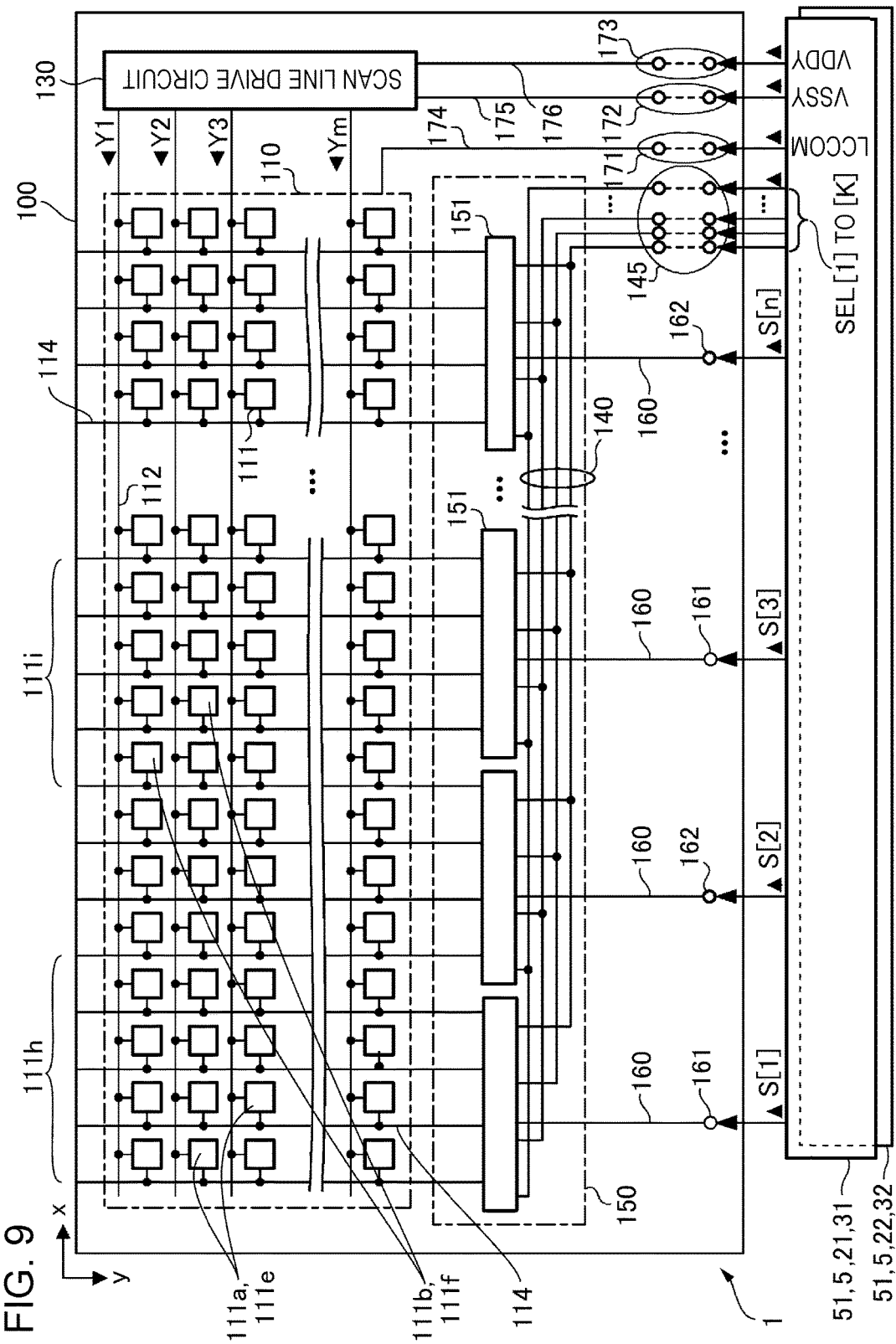
FIG. 9 is an explanatory diagram illustrating an aspect of an electrical configuration of the electro-optical device illustrated in FIG. 1.

FIG. 9 is an explanatory diagram illustrating one aspect of an electrical configuration of the electro-optical device 1 illustrated in FIG. 1. As illustrated in FIG. 9, the electro-optical panel 100 includes a pixel region 110 (display region), a scan line drive circuit 130, a data line selection circuit 150 (selection circuit), n image signal lines 160, n image signal input terminals (the first terminals 161 and the second terminals 162), k selection signal lines 140, k selection signal input terminals 145, a plurality of power supply terminals 171, 172, and 173, and power supply lines 174, 175, and 176 corresponding to the power supply terminals 171, 172, and 173, respectively. n is an integer of 1 or larger, and k is an integer of 2 or larger. In the form illustrated in FIG. 7, k=4. The elements are formed on the element substrate 101 illustrated in FIG. 2. On the element substrate 101, the data line selection circuit 150 is formed along one side of a peripheral portion of the pixel region 110, and the scan line drive circuit 130 is formed along another side crossing a side where the data line selection circuit 150 is formed.

The first drive IC 21 and the second drive IC 22 output image signals indicating an image to be displayed on the electro-optical panel 100 in accordance with a control signal, a control signal, image data, and the like which are input from an external high-level circuit (not illustrated) via the first flexible wiring substrate 31 and the second flexible wiring substrate 32 (see FIG. 2). The electro-optical panel 100 displays an image, based on a clock signal and an image signal which are input from the first drive IC 21, the first flexible wiring substrate 31, the second drive IC 22, and the second flexible wiring substrate 32. The first drive IC 21 and the second drive IC 22 have the same configuration and output the same signal except for the image signal.

The pixel region 110 displays an image. The pixel region 110 includes m scan lines 112, (k x n) data lines 114, and (m×k×n) pixels 111. m is an integer of 1 or larger. The pixel 111 includes a pixel electrode 118. The pixel 111 is provided corresponding to an intersection between the scan line 112 and the data line 114, and is arranged in a matrix of m rows x (k×n) columns. The scan lines 112 transmit scan signals Y1, Y2, Y3, . . . , Ym, and are provided in a row direction (x direction) from the scan line drive circuit 130. The data lines 114 transmit data signals, and are provided in a column direction (y direction) from the data line selection circuit 150.

In the pixel region 110, (k×m) pixels 111 corresponding to the k (column) data lines 114 form one pixel group (block). For example, there are provided a first pixel group 111h in which a plurality of (k columns) first pixel columns 111e, each including a plurality of (m) first pixels 111a arranged in the y direction, are arranged in the X direction, and a second pixel group 111i in which a plurality of (k columns) second pixel columns 111f, each including a plurality of (m) second pixels 111b arranged in the y direction, are arranged in the X direction. Here, the pixels 111 belonging to the same pixel group are connected to the same image signal line 160 via the data line selection circuit 150. Accordingly, the electro-optical panel 100 includes n (rows) pixel groups divided into n blocks by n (column) image signal lines 160 or n image signal input terminals (the first terminals 161 and the second terminals 162).

The scan line drive circuit 130 selects a row to write data from among the plurality of pixels 111 arranged in a matrix. Specifically, the scan line drive circuit 130 outputs a scan signal for selecting one scan line 112 from among the plurality of scan lines 112. The scan line drive circuit 130 supplies the scan signals Y1, Y2, Y3, . . . , Ym to the scan lines 112 of the first row, the second row, the third row, . . . , the m-th row. The scan signals Y1, Y2, Y3, . . . , Ym become, for example, a high level sequentially and exclusively.

In each pixel group, the data line selection circuit 150 selects a column (pixel column) of pixels 111 to which an image signal is written. Specifically, the data line selection circuit 150 selects at least one data line 114 from among the k data lines 114 belonging to the pixel group in accordance with the selection signals SEL[1] to SEL[k]. The data line 114 is connected to one image signal line 160 one by one by the data line selection circuit 150 by using k data lines as one unit. In the present form, the data line selection circuit 150 has n demultiplexers 151 corresponding to each of n pixel groups.

The image signal lines 160 connect the image signal input terminals (the first terminals 161 and the second terminals 162) to the data line selection circuit 150. The image signal line 160 transmits the image signals S (S[1] to S[n]) input from the first flexible wiring substrate 31 and the second flexible wiring substrate 32 via the image signal input terminals (the first terminals 161 and the second terminals 162) to the data line selection circuit 150, and is provided in n columns (pieces), corresponding to n image signal input terminals (the first terminals 161 and the second terminals 162) or each of n pixel groups. The image signal S indicates data to be written to the pixel 111. Here, an "image" means a still image or a moving image. One image signal line 160 is connected to k data lines 114 via a data line selection circuit 150. Thus, in the image signal S, data supplied to the k data lines 114 are time-division-multiplexed.

The selection signal lines 140 connect the selection signal input terminals 145 to the demultiplexers 151 of the data line selection circuit 150. The selection signal lines 140 (140[1] to 140[$k$]) transmit the selection signals SEL (SEL[1] to SEL[k]) input from the selection signal input terminal 145 (145[1] to 145[$k$]), and k selection signal lines are provided. The selection signals SEL sequentially become a high level.

The image signal input terminals (the first terminals 161 and the second terminals 162) are connected to the first flexible wiring substrate 31 and the second flexible wiring substrate 32, and the image signal S[j] is supplied therethrough (j is an integer satisfying 1≤j≤n). In this example, the image signals S[1], S[3], S[5], . . . , S[2$t$−1] are supplied from the first drive IC 21 to the image signal input terminals (the first terminals 161 and the second terminal 162) corresponding to the image signal lines 160 of odd-numbered columns among the first column, the third column, the fifth column, . . . , the (2$t$−1)th column (t is an integer satisfying 1≤t≤n/2). In addition, the image signals S[2], S[4], S[6], . . . , S[2$t$] are supplied from the second drive IC 22 to the image signal input terminals (the first terminals 161 and the second terminal 162) corresponding to the image signal lines 160 of even-numbered columns among the second column, the fourth column, the sixth column, . . . , the (2$t$)th column. The image signals S are so-called data signals, and analog signals having different waveforms according to display of an image are supplied to the image signal input terminals (the first terminals 161 and the second terminals 162).

The selection signal input terminals 145 are connected to the first flexible wiring substrate 31 and the second flexible wiring substrate 32, and selection signals SEL configured by pulse signals are supplied thereto. The selection signals SEL are timing signals for selecting the data lines 114 in the data line selection circuit 150. The selection signal input terminals 145 include a terminal to which the first flexible wiring substrate 31 is connected and a terminal which is connected to the second flexible wiring substrate 32, and the selection signal SEL is supplied from both or one of the first drive IC 21 of the first flexible wiring substrate 31 and the second drive IC 22 of the second flexible wiring substrate 32. In the present form, the selection signals SEL having the same waveform are supplied to the selection signal input terminals 145 corresponding to each of the first flexible wiring substrate 31 and the second flexible wiring substrate 32. Thus, the selection signal input terminals 145 are illustrated so as not to be distinguished as the terminal to which the first flexible wiring substrate 31 is connected and the terminal connected to the second flexible wiring substrate 32, but may be distinguished as the terminal to which the first flexible wiring substrate 31 is connected and the terminal to which the second flexible wiring substrate 32 is connected like the first terminal 161 and the second terminal 162.

The power supply terminal 171, the power supply terminal 172, and the power supply terminal 173 are connected to the first flexible wiring substrate 31 and the second flexible wiring substrate 32, and power supply voltages are supplied from a high-level circuit thereto via the first flexible wiring substrate 31 and the second flexible wiring substrate 32 without passing through the first drive IC 21 and the second drive IC 22. The power supply voltages are used as power sources in the electro-optical panel 100, and are DC voltages in this example. The power supply terminal 171 supplies a voltage LCCOM, the power supply terminal 172 supplies a voltage VSSY, and the power supply terminal 173 supplies a voltage VDDY. The voltage LCCOM is a reference potential of a voltage applied to a liquid crystal layer. The voltage VSSY is a power supply potential on a low voltage side of the scan line drive circuit 130. The voltage VDDY is a power supply potential on a high voltage side of the scan line drive circuit 130. The power supply terminals 171, 172, 173 are illustrated so as not to be distinguished as the terminal to which the first flexible wiring substrate 31 is connected and the terminal connected to the second flexible wiring substrate 32, but may be distinguished as the terminal to which the first flexible wiring substrate 31 is connected and the terminal connected to the second flexible wiring substrate 32 like the first terminal 161 and the second terminal 162.

Each of the power supply terminals 171, 172, and 173 may be provided on both sides in the x direction. This is to correspond to a configuration in which the scan line drive circuit 130 is provided on each of the left and right sides of the element substrate 101. In the present form, only one scan line drive circuit 130 is configured, and thus, the power supply terminals 172 and 173 are provided only on one side in the x direction.

In the present embodiment, data to be written to the pixels 111 of the [k×j−k+1]th column to the [k×j]th column which are the k pixels 111 of the corresponding pixel group is time-division-multiplexed in the image signal S[j]. In addition, in a case where S[j] is an odd-numbered S[2$t$−1], the image signal is supplied from the first drive IC 21 to the data line 114 of the odd-numbered pixel group. In a case where S[j] is an even-numbered S[2$t$], the image signal is supplied from the second drive IC 22 to the data line 114 of the even-numbered pixel group. According to such a configuration, two drive ICs of the first drive IC 21 and the second drive IC 22 are used, and thus, it is possible to write data to twice as many pixels in one cycle as compared with a case of using one drive IC. As described above, by disposing the first terminal 161 and the second terminal 162, a high definition, high quality, and compact electro-optical device 1 can be realized.

Main Effect of Present Form

As described above, in the electro-optical device 1 according to the present form, the plurality of mounting substrates 5 respectively have the first flexible wiring substrate 31 and the second flexible wiring substrate 32 of which end portions 312 and 322 are connected to the first extension substrate 41 and the second extension substrate 42 configured by flexible wiring substrates. Thus, since the first flexible wiring substrate 31 and the second flexible wiring substrate 32 used for the mounting substrates 5 can be shortened, cost can be reduced.

In addition, since the connection portion 418 between the first mounting substrate 51 and the first extension substrate 41 and the connection portion 428 between the second mounting substrate 52 and the second extension substrate 42 are covered by the first protective film 91 and the second protective film 92 having insulation properties and moisture resistance, it is possible to enhance strength, moisture resistance, insulation properties, and the like of the connection portions 418 and 428. Therefore, the reliability of the connection portions 418 and 428 can be enhanced. In addition, since the protective film 912 (the first protective film 91) and the protective film 922 (the second protective film 92) cover the first drive IC 21 and the second drive IC 22, it is possible to protect the connection portion between the first drive IC 21 and the first flexible wiring substrate 31 and the connection portion between the second drive IC 22 and the second flexible wiring substrate 32. Therefore, the reliability of the mounting substrates 5 (the first mounting substrate 51 and the second mounting substrate 52) can be enhanced.

Particularly, the first drive IC 21 is mounted on the first flexible wiring substrate 31 at a position where at least a part of the first drive IC overlaps the second flexible wiring substrate 32, the second drive IC 22 is mounted on the second flexible wiring substrate 32 such that at least a part of the second drive IC overlaps the first flexible wiring substrate 31, and the first drive IC 21 and the second drive IC 22 are both positioned to be close to the element substrate 101. Accordingly, by connecting the first extension substrate 41 and the second extension substrate 42 to the first flexible wiring substrate 31 and the second flexible wiring substrate 32, the expensive first flexible wiring substrate 31 and the expensive second flexible wiring substrate 32 can be greatly shortened. Thus, it is possible to reduce cost of the first flexible wiring substrate 31 on which the first drive IC 21 is mounted and the second flexible wiring substrate 32 on which the second drive IC 22 is mounted.

In addition, since the plurality of mounting substrates 5 (the first mounting substrate 51 and the second mounting substrate 52) connected to the electro-optical panel 100 are configured such that sizes of the flexible wiring substrates (the first flexible wiring substrate 31 and the second flexible wiring substrate 32) and mounting positions of the drive ICs (the first drive IC 21 and the second drive IC 22) are the same, it is not necessary to prepare a plurality of types of mounting substrates 5. Thus, it is possible to reduce cost.

In addition, in the plurality of mounting substrates 5, parts of the respective drive ICs (the first drive IC 21 and the second drive IC 22) overlap each other in a thickness direction. Accordingly, since the drive ICs that are heat generating sources are collected, it is easy to take measures against heat by using the first heat dissipation plate portion 73 and the second heat dissipation plate portion 74.

In addition, the first drive IC 21 is mounted on the center of the first flexible wiring substrate 31 in a length direction or on the element substrate 101 side from the center, and the second drive IC 22 is mounted on the center of the second flexible wiring substrate 32 in a length direction or on the element substrate 101 side from the center. Accordingly, deterioration hardly occurs in analog signals output from the first drive IC 21 and the second drive IC 22 to the element substrate 101. Since each of the plurality of mounting substrates 5 is a single-sided wiring substrate, it is possible to reduce cost.

In addition, since the first end portion 412 of the first extension substrate 41 and the second end portion 422 of the second extension substrate 42 extend on the same linear line L without overlapping each other, work is easily done when the first end portion 412 of the first extension substrate 41 and the second end portion 422 of the second extension substrate 42 are connected to a high-level circuit or the like. For example, if the first end portion 412 of the first extension substrate 41 and the second end portion 422 of the second extension substrate 42 overlap each other, the second end portion 422 needs to be inserted into the second socket 629 of a connector by turning over the first end portion 412. According to the present form, it is possible to insert the second end portion 422 into the second socket 629 of the connector without requiring such labor. In addition, since the first end portion 412 and the second end portion 422 extend on the same linear line L, the first socket 619 and the second socket 629 can be linearly disposed on the wiring substrate 60. Thus, it is possible to efficiently perform the work of inserting the first end portion 412 and the second end portion 422 into the first socket 619 and the second socket 629.

Another Aspect of Electro-Optical Device 1

Figure 10:
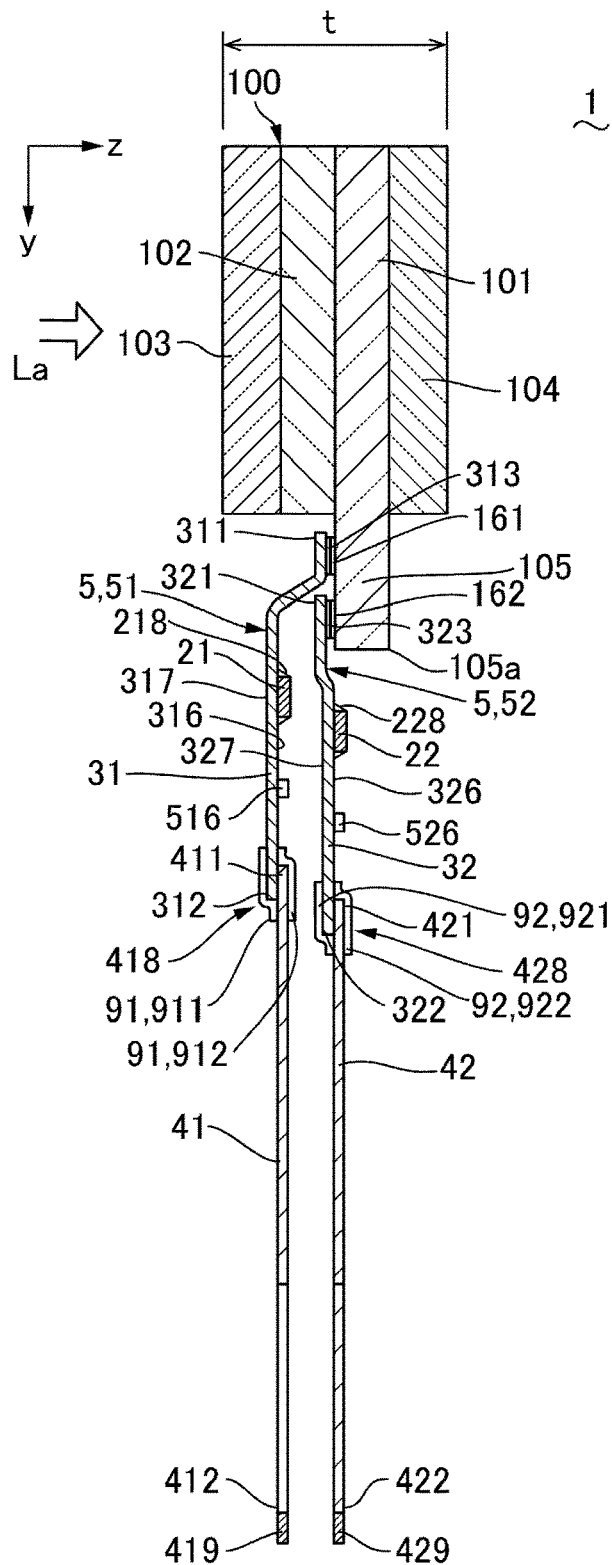
FIG. 10 is an explanatory view illustrating another state of the electro-optical device to which the invention is applied.
Figure 11:
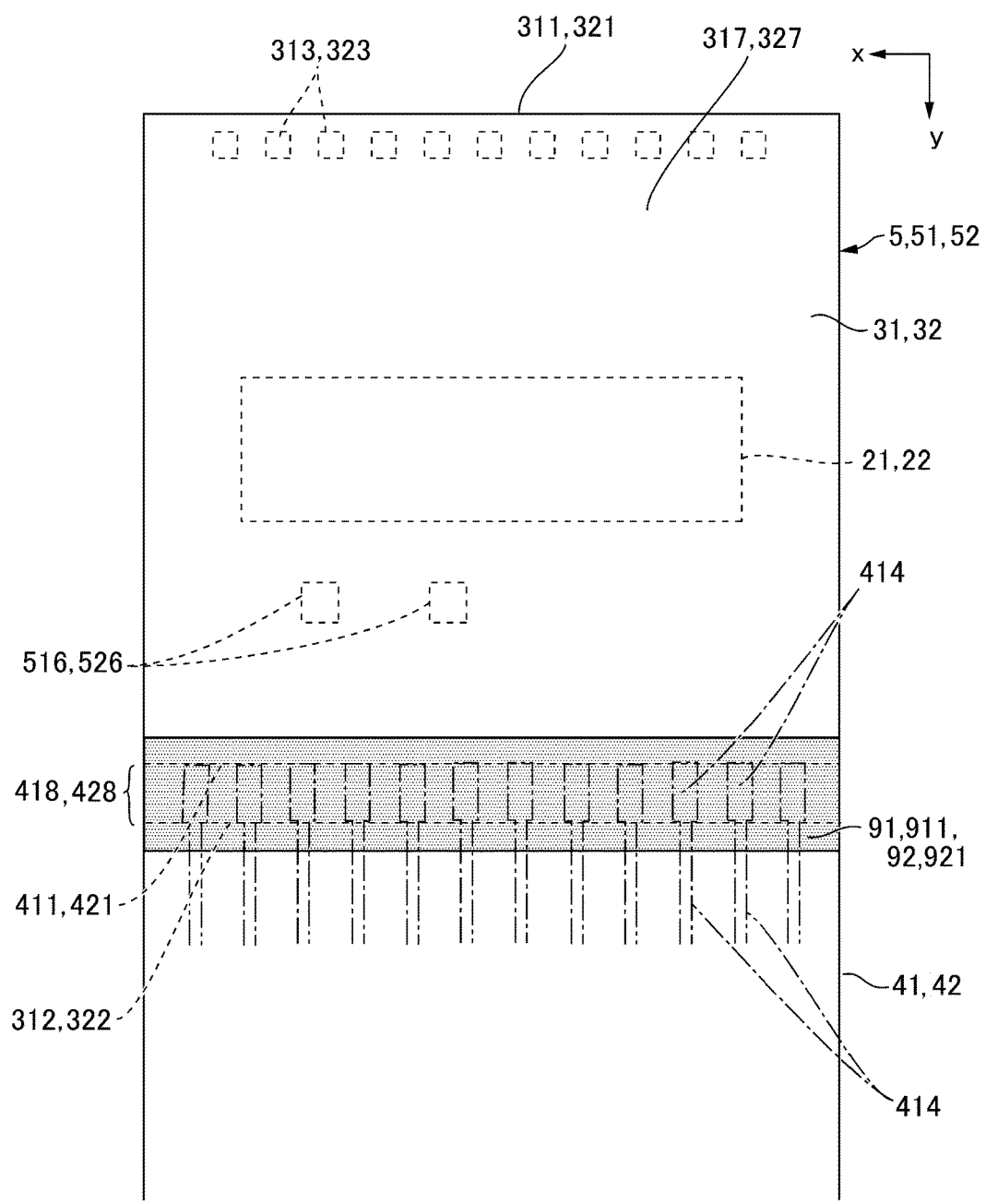
FIG. 11 is an explanatory view when a connection portion between a mounting substrate and an extension substrate illustrated in FIG. 10 is viewed from the other surface side of the mounting substrate.
Figure 12:
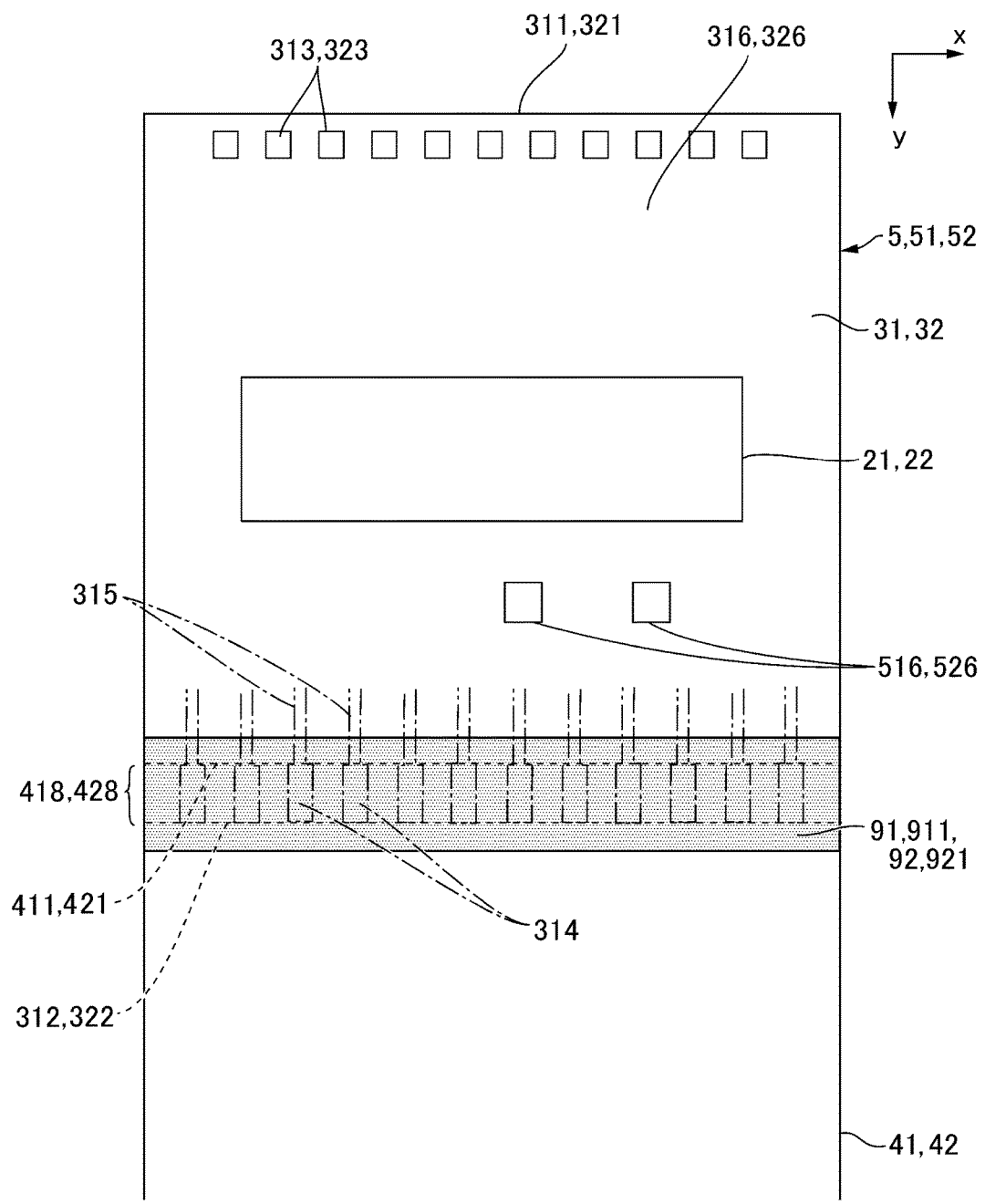
FIG. 12 is an explanatory view when the connection portion between a mounting substrate and an extension substrate illustrated in FIG. 10 is viewed from one surface side of the mounting substrate.
Figure 13:
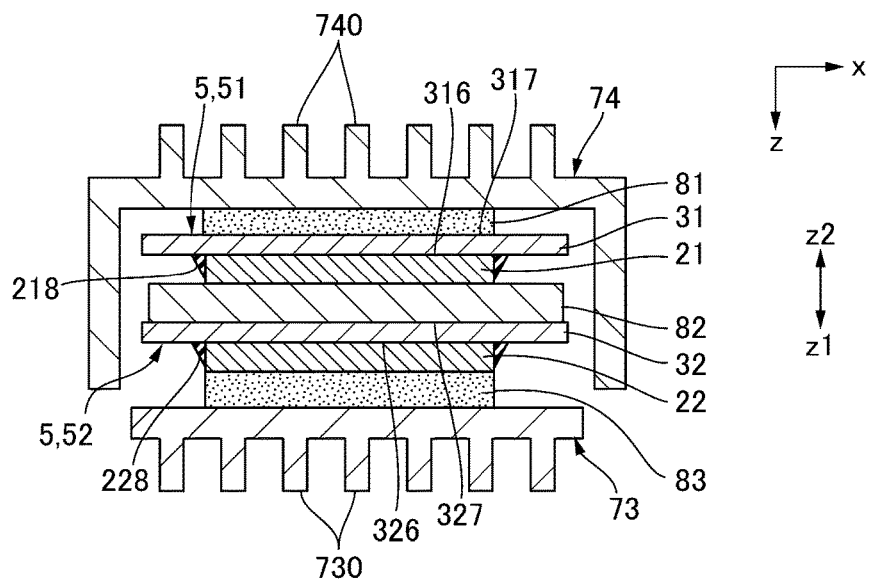
FIG. 13 is a sectional view schematically illustrating a state where the electro-optical device illustrated in FIG. 10 is cut in a direction orthogonal to an extension direction of the mounting substrate.
Figure 14:
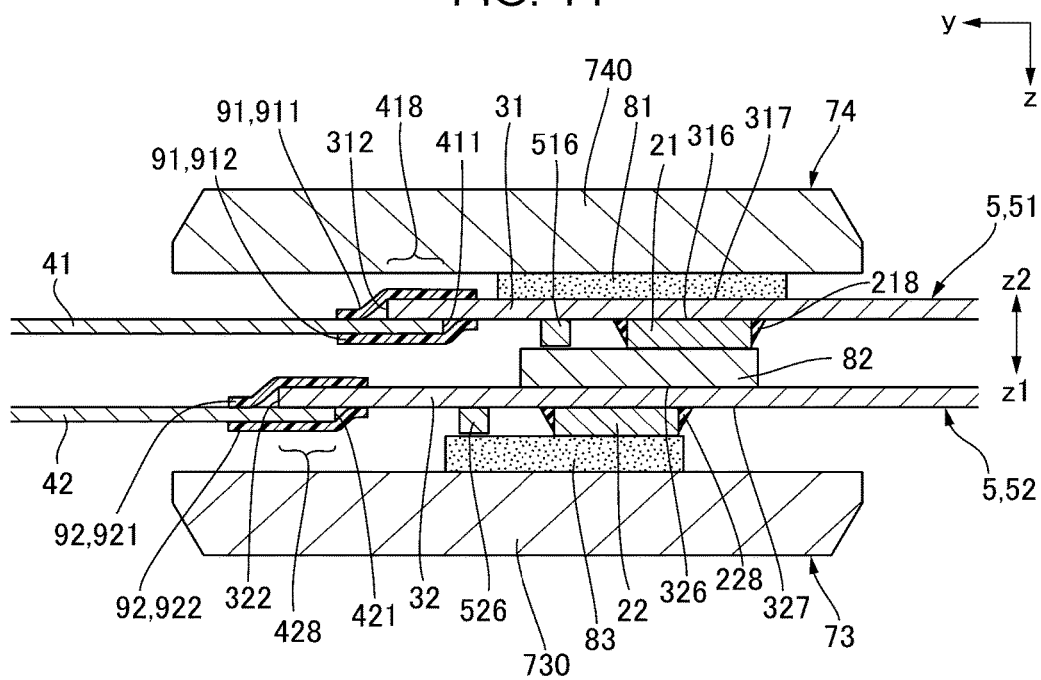
FIG. 14 is a sectional view schematically illustrating a state where the electro-optical device illustrated in FIG. 10 is cut in the extension direction of the mounting substrate.

FIG. 10 is an explanatory view according to another aspect of the electro-optical device 1 to which the invention is applied, and is an explanatory view schematically illustrating a state of being cut along the electro-optical panel 100 and the second flexible wiring substrate 32. FIG. 11 is an explanatory view when a connection portion between the mounting substrate 5 and one of the extension substrates 41 and 42 illustrated in FIG. 10 is viewed from the other surface side of the mounting substrate 5. FIG. 12 is an explanatory view when a connection portion between the mounting substrate 5 and the other of the extension substrates 41 and 42) illustrated in FIG. 10 is viewed from one surface side of the mounting substrate. FIG. 13 is a sectional view schematically illustrating a state where the electro-optical device 1 illustrated in FIG. 10 is cut in a direction orthogonal to an extension direction of the mounting substrate, and corresponds to the cross-sectional view taken along line VII-VII illustrated in FIG. 7. FIG. 14 is a sectional view schematically illustrating a state where the electro-optical device 1 illustrated in FIG. 10 is cut in the extension direction of the mounting substrate, and corresponds to the cross-sectional view taken along line VIII-VIII illustrated in FIG. 8. Since basic configurations according to the present form are the same as those described with reference to FIGS. 1 to 9, the same parts are denoted by the same symbols or reference numerals, and description thereof will be omitted. In addition, only a part of the wires is schematically illustrated in FIGS. 11 and 12.

In FIG. 10, the electro-optical device 1 according to the present form also includes the electro-optical panel 100 and a plurality of mounting substrates 5 connected to one side of the electro-optical panel 100, in the same manner as in the aspect described with reference to FIGS. 1 to 9. While not illustrated in FIG. 10, the electro-optical panel 100 is supported by the holder 70 described with reference to FIGS. 1 and 2.

On the element substrate 101 of the electro-optical panel 100, on one side of the electro-optical panel 100 (one side of the element substrate 101 (a side of the element substrate 101), the plurality of mounting substrates 5 on which the drive ICs are mounted on one surface side of flexible wiring substrate are connected to the one side (one side 105a of the element substrate 101) of the electro-optical panel 100 in a state of being overlapped with each other. In the present embodiment, the two mounting substrates 5 are connected to the electro-optical panel 100 in a state of being overlapped. More specifically, on the element substrate 101, the first mounting substrate 51 on which the first drive IC 21 is mounted on the one surface 316 of the first flexible wiring substrate 31, and the second mounting substrate 52 on which the second drive IC 22 is mounted on the one surface 326 of the second flexible wiring substrate 32 are connected to the electro-optical panel 100 in a state of being overlapped in the z direction. The first mounting substrate 51 and the second mounting substrate 52 have the same mounting positions of the first drive IC 21 and the second drive IC 22 and the same widths (dimensions in the x direction), lengths (dimensions in the y direction), wiring patterns and the like of the first flexible wiring substrate 31 and the second flexible wiring substrate 32 as the first flexible wiring substrate 31 and the second flexible wiring substrate 32. Thus, both the first drive IC 21 and the second drive IC 22 are disposed in a region where the first flexible wiring substrate 31 and the second flexible wiring substrate 32 overlap each other. In the present form, single-sided wiring substrates are used for the first flexible wiring substrate 31 and the second flexible wiring substrate 32, and output electrodes (first output electrode 313 and second output electrode 323), mounting electrodes of the first drive IC 21 and the second drive IC 22, wires and the like (not illustrated) are formed on the one surface 316 and the one surface 326 of the first flexible wiring substrate 31 and the second flexible wiring substrate 32.

In the first mounting substrate 51, one end 411 of the first extension substrate 41 is connected to an end portion 312 on the side opposite to the element substrate 101 side with respect to the first drive IC 21 of the first flexible wiring substrate 31. On the second mounting substrate 52, one end 421 of the second extension substrate 42 is connected to an end portion 322 on a side opposite to the element substrate 101 side with respect to the second drive IC 22 of the second flexible wiring substrate 32.

The first protective film 91 is affixed to the connection portion 418 between the first mounting substrate 51 and the first extension substrate 41 so as to be covered with at least one of the one surface 316 side and the other surface 317 side opposite to the one surface 316. In addition, the second protective film 92 is affixed to the connection portion 428 between the second mounting substrate 52 and the second extension substrate 42 so as to be covered with at least one of the one surface 326 side and the other surface 327 side opposite to the one surface 326.

As illustrated in FIGS. 10, 11, and 12, in the present form, a protective film 911 (the other surface side protective film) covering the connection portion 418 between the first mounting substrate 51 and the first extension substrate 41 from the other surface 317 side, and a protective film 912 (one-surface side protective film) covering the connection portion 418 between the first mounting substrate 51 and the first extension substrate 41 from the one surface 316 side, as the first protective film 91. In addition, a protective film 921 (the other surface side protective film) covering the connection portion 428 between the second mounting substrate 52 and the second extension substrate 42 from the other surface 327 side, and a protective film 922 (one-surface side protective film) covering the connection portion 428 between the second mounting substrate 52 and the second extension substrate 42 from one surface 326 side, as the second protective film 92.

Here, the first protective film 91 (protective films 911 and 912) and the second protective film 92 (protective films 921 and 922) have the same configuration such as material or sizes as each other. Accordingly, in the following description, the first protective film 91 (protective films 911 and 912) provided in the connection portion 418 between the first mounting substrate 51 and the first extension substrate 41 will be mainly described, and with respect to the second protective film 92 (protective films 921 and 922), reference numerals thereof are attached to parentheses in FIGS. 11 and 12, and detailed description thereof will be omitted.

In the present form, the first protective film 91 (protective films 911 and 912) is formed of an adhesive film including a film such as polyester, polyimide, and polyethylene terephthalate, and has insulation properties and moisture resistance. In the present form, the first protective film 91 is formed of a polyester film.

A thickness of the first protective film 91 is greater than or equal to 0.1 mm. Thus, since the first protective film 91 has a certain degree of rigidity, it is easy to perform an affixation work or the like. The first protective film 91 is an adhesive film in which an adhesive layer (pressure-sensitive adhesive layer) is previously provided on a surface on a side to adhere to the connection portion 418, and a thickness of the adhesive layer is, for example, 45±6 μm between the first protective film 91 and the connection portion 418. Thus, it is possible to adequately adhere the first protective film 91 to the connection portion 418, and it is also possible to suppress intrusion of moisture into the connection portion 418 via the adhesive layer.

In the first protective film 91, each of the protective films 911 and 912 extends from the connection portion 418 to a position on the way toward the first drive IC 21, and does not overlap the first drive IC 21, on the other surface 317 side and the one surface 316 side. In the present form, each of the protective films 911 and 912 extends from the connection portion 418 to a position on the way toward an electronic component 516, and does not overlap the electronic component 516. A thickness of the first protective film 91 is greater than or equal to 0.1 mm and is smaller than or equal to a thickness of the first drive IC 21. Thus, even if the protective film 912 is affixed to the connection portion 418, it is possible to suppress thickening of the first mounting substrate 51. In the present form, the thickness of the first drive IC 21 is approximately 1 mm.

In addition, the protective films 911 and 912 are equal in size, and when viewed from a thickness direction of the mounting substrate 5, the protective films 911 and 912 are provided at positions which overlap each other. Thus, there is an advantage that a common positioning jig can be used in a step of affixing the protective film 911 to the connection portion 418 and a step of affixing the protective film 912 to the connection portion 418.

In the present form, as will be described below with reference to FIGS. 11 and 12, when viewed from the thickness direction of the mounting substrate 5, sizes and positions of the protective films 911 and 912 are set such that the protective films overlap all the terminals 314 (electrodes) of the first mounting substrate 51 and all the terminals 414 (electrodes) of the first extension substrate 41 which are electrically connected to the connection portion 418. Thus, it is possible to suppress intrusion of moisture into the connection portion 418 by the protective films 911 and 912.

More specifically, as illustrated in FIG. 11, a plurality of the terminals 414 are arranged along one end 411, and the first wires 415 extend from the respective terminals 414, on a surface on a side where the first mounting substrate 51 is located, in the first extension substrate 41. The first wires 415 are covered with an insulation protective layer, but the plurality of terminals 414 are exposed from the insulation protective layer at the time before the first extension substrate 41 is connected to the first mounting substrate 51.

In addition, as illustrated in FIG. 12, a plurality of the terminals 314 are arranged along one end portion 312, and wires 315 extend from the respective terminals 314, on a surface on a side where the first extension substrate 41 is located, in the first mounting substrate 51. The first wires 315 are covered with an insulation protective layer, but the plurality of terminals 314 are exposed from the insulation protective layer at the time before the first extension substrate 41 is connected to the first mounting substrate 51.

Thus, in a case where a positional shift does not occur between the first extension substrate 41 and the first mounting substrate 51 when the first extension substrate 41 is connected to the first mounting substrate 51, all the terminals 414 are covered with the first mounting substrate 51, and all the terminals 314 are covered with the first extension substrate 41. In this state, sizes of the protective films 911 and 912 may be slightly larger than the connection portion 418. In the present form, a dimension of the connection portion 418 in the y direction is, for example, 5 mm.

However, in a case where the positional shift occurs in which a dimension of the connection portion 418 in the y direction is narrowed on the first extension substrate 41 and the first mounting substrate 51, a part of the terminal 414 is exposed from the first mounting substrate 51 and a part of the terminal 314 is exposed from the first extension substrate 41. Also in this case, the present form manages such that the dimensions of exposed portions of the terminals 314 and 414 are 1 mm or less, for example, 0.6 mm or less, and dimensions of the protective films 911 and 912 in the y direction and positions of the protective films 911 and 912 in the y direction are set such that the protective films 911 and 912 can cover all the terminals 314 and 414 even in a case where the positional shift in the y direction occurs.

In addition, in a case where a positional shift in the x direction occurs in the first extension substrate 41 and the first mounting substrate 51, a part of the terminal 414 located at the end portion in the x direction is exposed from the first mounting substrate 51, and a part of the terminal 314 located at the end portion in the x direction is exposed from the first extension substrate 41. Also in this case, the present form manages such that the dimensions of the exposed portions of the terminals 314 and 414 in the y direction are 1 mm or less, and dimensions of the protective films 911 and 912 in the x direction and positions of the protective films 911 and 912 in the x direction are set such that the protective films 911 and 912 can cover all the terminals 314 and 414 even in a case where the positional shift in the x direction occurs. A configuration of the second protective film 92 is substantially the same as the configuration of the first protective film 91.

In the present form, since the first protective film 91 (protective film 912) and the second protective film (protective film 922) do not overlap the first drive IC 21 and the second drive IC 22, respectively, a structure between the first heat dissipation plate portion 73 and the second heat dissipation plate portion 74 illustrated in FIG. 2 or the like is the same as a structure illustrated in FIGS. 13 and 14. First, the first drive IC 21 and the second drive IC 22 are not covered with the first protective film 91 and the second protective film 92, but protective layers 218 and 228 having insulation properties and moisture resistance are provided around the first drive IC 21 and the second drive IC 22. Accordingly, it is possible to enhance moisture resistance of an electrical connection portion between the first drive IC 21 and the second drive IC 22.

Filling materials that fill a gap on one surface 316 and 326 sides and a gap on the other surface 317 and 327 sides with respect to portions where the first drive IC 21 and the second drive IC 22 are mounted are disposed between the first heat dissipation plate portion 73 and the second heat dissipation plate portion 74. Thus, it is possible to enable heat generated by the first drive IC 21 and the second drive IC 22 to efficiently escape from the first heat dissipation plate portion 73 and the second heat dissipation plate portion 74.

In the present form, the adhesive layer 81 (filling material) is provided between the other surface 317 of the first flexible wiring substrate 31 of the first mounting substrate 51 and the second heat dissipation plate portion 74. On the one surface 316 side of the first flexible wiring substrate 31 of the first mounting substrate 51, a heat transfer sheet 82 (filling material) formed of a silicone sheet or the like is provided between the first drive IC 21 and the other surface 327 of the second flexible wiring substrate 32 of the second mounting substrate 52. On one surface 326 side of the second flexible wiring substrate 32 of the second mounting substrate 52, the adhesive layer 83 (filling material) is provided between the second drive IC 22 and the first heat dissipation plate portion 73. Other configurations are substantially the same as the configurations described with reference to FIGS. 1 to 9.

Another Embodiment

A case where the number of mounting substrates 5 is two is exemplified in the above-described embodiment, but the invention may be applied to a case where the number of mounting substrates 5 is three or more. In the above-described embodiment, the electro-optical device 1 is a liquid crystal device, but the invention may be applied to a case where the electro-optical device 1 is an organic electroluminescence device.

Example of Mounting on Electronic Apparatus

Figure 15:
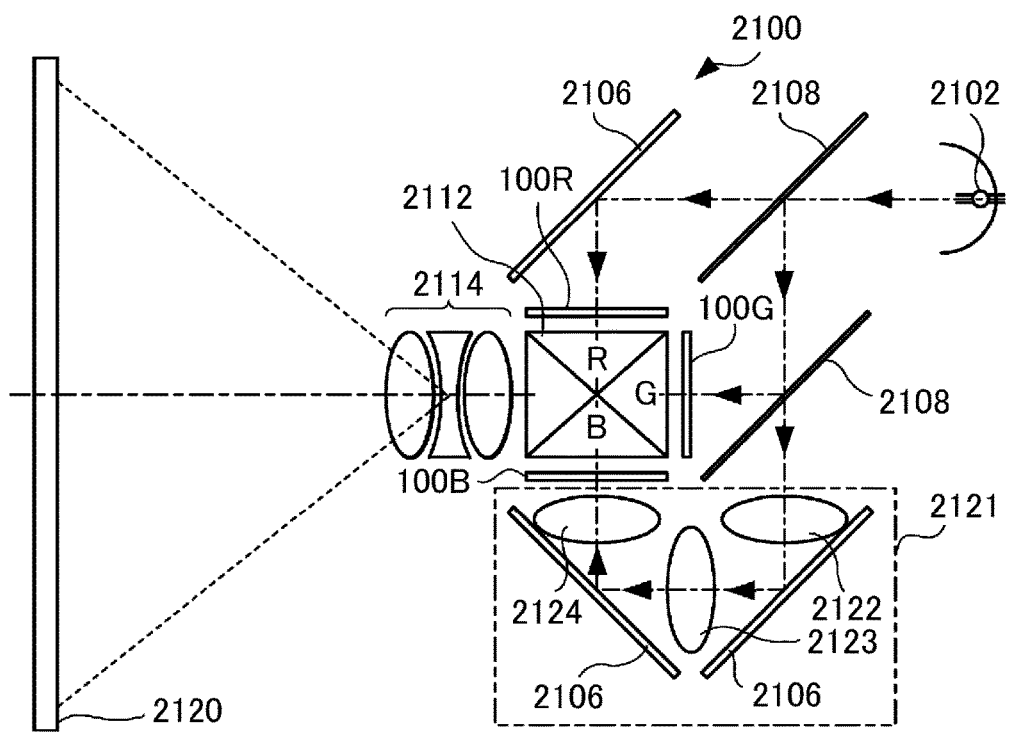
FIG. 15 is a schematic configuration view of a projection type display device which uses the electro-optical device to which the invention is applied.

An electronic apparatus which uses the electro-optical device 1 according to the above-described embodiment will be described. FIG. 15 is a schematic configuration view of a projection type display device (electronic apparatus) which uses the electro-optical device 1 to which the invention is applied. A projection type display device 2100 illustrated in FIG. 15 is an example of an electronic apparatus which uses the electro-optical device 1. In the projection type display device 2100, the electro-optical device 1 is used as a light valve, and high-definition and bright display can be performed without enlarging the device. As illustrated in the figure, a lamp unit 2102 (light source unit) including a white light source such as a halogen lamp is provided inside the projection type display device 2100. Projected light emitted from the lamp unit 2102 is separated into three primary colors of R (red), G (green), and B (blue) by three mirrors 2106 and two dichroic mirrors 2108 arranged therein. The separated projection light is guided to light valves 100R, 100G and 100B corresponding to the respective primary colors. Since light of the B color has a long optical path as compared with the other R color and G color, the light of the B color is guided through a relay lens system 2121 including an incident lens 2122, a relay lens 2123, and an emission lens 2124 so as to prevent loss from being made.

In the projection type display device 2100, three sets of liquid crystal devices, each including the electro-optical device 1, are provided corresponding to the R, G, and B colors, respectively. Configurations of the light valves 100R, 100G, and 100B are the same as the configuration of the above-described electro-optical panel 100, and are connected to a high-level circuit in the projection type display device 2100 via the first extension substrate 41 and the second extension substrate 42, respectively. Image signals for designating gradation levels of primary color components of each of R color, G color, and B color are respectively supplied from an external high-level circuit, processed by a high-level circuit in the projection type display device 2100, and the light valves 100R, 100G, and 100B are respectively driven. Lights modulated by the light valves 100R, 100G, and 100B, respectively, are incident on a dichroic prism 2112 from three directions. Then, in the dichroic prism 2112, the R color light and the B color light are reflected at 90 degrees, and the G color light transmits. Thus, after images of the respective primary colors are synthesized, a color image is projected on a screen 2120 by a projection lens group 2114 (projection optical system).

Another Projection Type Display Device

An LED light source or the like for emitting light of each color may be used as a light source unit for the projection type display device, and the projection type display device is configured such that color lights emitted from the LED light sources are supplied to other liquid crystal devices, respectively.

Another Electronic Apparatus

An electronic apparatus including the electro-optical device 1 to which the invention is applied is not limited to the projection type display device 2100 according to the above-described embodiment. The electronic apparatus may be used for an electronic device, for example, a projection type head up display (HUD), a direct view type head mounted display (HMD), a personal computer, a digital still camera, a liquid crystal television, or the like.

The entire disclosure of Japanese Patent Application No. 2017-019305 filed Feb. 6, 2017 and No. 2017-200122 filed Oct. 16, 2017 are expressly incorporated by reference herein.

What is claimed is:

1. An electro-optical device comprising:
   an electro-optical panel having a two dimensional display area;
   a first substrate that includes a flexible wiring substrate of which an end portion is connected to the electro-optical panel and includes a drive IC which is mounted on one surface of the flexible wiring substrate;
   a second substrate that includes an extension flexible wiring substrate of which one end is bonded to another end portion of the flexible wiring substrate on a side opposite to the electro-optical panel with respect to the drive IC of the first substrate, the first substrate being arranged between the electro-optical panel and the second substrate in a plane parallel to the display area;
   a connection portion located where the first substrate and the second substrate meet, the connection portion including a part of the first substrate and a part of the second substrate, the part of the first substrate and the part of the second substrate included in the connection portion contacting and overlapping each other on a surface of the part of the first substrate, the connection portion having a first surface and a second surface each extending in a two dimensional area parallel to the one surface of the first substrate; and
   a protective film that is formed on and contacts the first surface and the second surface of the connection portion,
   wherein the protective film includes a first protective film formed on and contacting the first surface of the connection portion and a second protective film formed on and contacting the second surface of the connection portion, and
   the first protective film and the second protective film are equal in size.

2. The electro-optical device according to claim 1, wherein the protective film extends from the connection portion to a position covering the drive IC, on the one surface side.

3. The electro-optical device according to claim 1, wherein the protective film extends from the connection portion to a position on a way toward the drive IC, on another surface of the flexible wiring substrate, the other surface being opposite to the one surface.

4. The electro-optical device according to claim 3, wherein a thickness of the protective film is greater than or equal to 0.1 mm and is smaller than or equal to a thickness of the drive IC.

5. The electro-optical device according to claim 1, wherein, when viewed from a thickness direction of the first substrate, the first protective film and the second protective film are provided at positions where the first protective film and the second protective film overlap each other.

6. The electro-optical device according to claim 1, wherein the protective film has insulation properties and moisture resistance.

7. The electro-optical device according to claim 6, wherein the protective film is a polyester film.

8. The electro-optical device according to claim 1,
   wherein an adhesive layer is provided between the protective film and the connection portion, and
   wherein a thickness of the adhesive layer is 45 ±6 μm.

9. The electro-optical device according to claim 1, wherein the protective films respectively overlap all terminals of the first substrate and all terminals of the second substrate, which are respectively electrically connected in the connection portion, when viewed from a thickness direction of the first substrate.

10. The electro-optical device according to claim 1, further comprising:
    a holder that supports the electro-optical panel from both sides of the electro-optical panel in a thickness direction,
    wherein the holder includes a first holder member that supports the electro-optical panel from one side in the thickness direction, a second holder member that supports the electro-optical panel from the other side in the thickness direction, a first heat dissipation plate portion that overlaps a portion where the drive IC of the first substrate is mounted from one side of the electro-optical panel in the thickness direction, and a second heat dissipation plate portion that overlaps a portion where the drive IC of the first substrate is mounted from the other side of the electro-optical panel in the thickness direction.

11. The electro-optical device according to claim 10, wherein filling materials that fill a gap on the one surface side and a gap on the other surface side with respect to a portion where the drive IC of the first substrate is mounted are disposed between the first heat dissipation plate portion and the second heat dissipation plate portion.

12. The electro-optical device according to claim 1, wherein a plurality of the first substrates are connected to one side of the electro-optical panel in a state of being overlapped in a thickness direction.

13. The electro-optical device according to claim 12, wherein two substrates of the plurality of first substrates are connected to the electro-optical panel.

14. An electronic apparatus comprising:
the electro-optical device according to claim 1.

15. An electro-optical device comprising:
an electro-optical panel;
a first substrate that is electrically connected to the electro-optical panel, the first substrate including:
a first flexible wiring substrate that is electrically connected to the electro-optical panel, the first flexible wiring substrate including a first surface and a second surface that is opposite to the first surface,
a first terminal that is disposed on the first surface of the first flexible wiring substrate, and
a drive IC that is mounted on the first surface of the flexible wiring substrate;
a second substrate that is electrically connected to the first substrate, the second substrate including:
a second flexible wiring substrate that includes a third surface and a forth surface that is opposite to the third surface, and
a second terminal that is disposed on the third surface of the second flexible wiring substrate, the second terminal being electrically connected to the first terminal of the first substrate;
a first protective film that covers the first surface of the first flexible wiring substrate and the forth surface of the second flexible wiring substrate, the first protective film at least overlapping the first terminal and the second terminal in a planar view; and
a second protective film that covers the second surface of the first flexible wiring substrate and the third surface of the second flexible wiring substrate, the first protective film at least overlapping the first terminal and the second terminal in the planar view.

* * * * *